(12) United States Patent
Shin

(10) Patent No.: US 12,193,232 B2
(45) Date of Patent: Jan. 7, 2025

(54) SEMICONDUCTOR DEVICE INCLUDING SEPARATION PATTERNS AND AN ELECTRONIC SYSTEM

(71) Applicant: SAMSUNG ELECTRONICS CO., LTD., Suwon-si (KR)

(72) Inventor: Joongshik Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 17/488,576

(22) Filed: Sep. 29, 2021

(65) Prior Publication Data

US 2022/0238550 A1  Jul. 28, 2022

(30) Foreign Application Priority Data

Jan. 28, 2021  (KR) .................. 10-2021-0012103

(51) Int. Cl.
*H10B 43/27* (2023.01)
*H10B 43/10* (2023.01)
(Continued)

(52) U.S. Cl.
CPC ............. *H10B 43/27* (2023.02); *H10B 43/10* (2023.02); *H01L 24/08* (2013.01);
(Continued)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS 9,508,730 B2  11/2016  Lee et al.
9,530,789 B2  12/2016  Lee et al.
(Continued)

FOREIGN PATENT DOCUMENTS

KR  10-2011-0120536  11/2011

*Primary Examiner* — Didarul A Mazumder
*Assistant Examiner* — Gustavo G Ramallo
(74) *Attorney, Agent, or Firm* — F. CHAU & ASSOCIATES, LLC

(57) ABSTRACT

A semiconductor device including: a horizontal wiring layer; a stack structure including a plurality of mold layers and a plurality of wiring layers alternately stacked on the horizontal wiring layer; a plurality of channel structures extending through the stack structure; and a plurality of separation patterns extending through the stack structure, wherein each of the plurality of separation patterns includes a plurality of first areas and a plurality of second areas adjacent to the plurality of first areas, wherein each of the plurality of first areas has a smaller width than each of the plurality of second areas.

17 Claims, 42 Drawing Sheets

(51) Int. Cl.
*H01L 23/00* (2006.01)
*H01L 25/065* (2023.01)
*H01L 25/18* (2023.01)

(52) U.S. Cl.
CPC .......... *H01L 25/0657* (2013.01); *H01L 25/18* (2013.01); *H01L 2224/08145* (2013.01)

(56) References Cited

U.S. PATENT DOCUMENTS

| | | |
|---|---|---|
| 9,985,048 B2 | 5/2018 | Lee |
| 10,192,880 B2 | 1/2019 | Lee |
| 10,411,033 B2 | 9/2019 | Kim et al. |
| 10,651,198 B2 | 5/2020 | Baek et al. |
| 2017/0162591 A1* | 6/2017 | Choi ..................... H10B 43/27 |
| 2018/0374869 A1* | 12/2018 | Kim ..................... H10B 43/27 |
| 2019/0333931 A1* | 10/2019 | Jung ..................... H10B 41/27 |
| 2019/0393238 A1* | 12/2019 | Lim ..................... H01L 23/5226 |

\* cited by examiner

SEMICONDUCTOR DEVICE INCLUDING SEPARATION PATTERNS AND AN ELECTRONIC SYSTEM

CROSS-REFERENCE TO RELATED APPLICATION

This non-provisional patent application claims priority under 35 U.S.C. § 119 to Korean Patent Application No. 10-2021-0012103, filed on Jan. 28, 2021, in the Korean Intellectual Property Office, the disclosure of which is incorporated by reference herein in its entirety.

TECHNICAL FIELD

Embodiments of the disclosure relate to a semiconductor device including word line separation patterns, an electronic system including the same, and a formation method thereof.

DESCRIPTION OF THE RELATED ART

In an electronic system that stores large amounts of data, a semiconductor device having a large data storage capacity is needed. One of the devices used to increase the data storage capacity of a semiconductor device is a three-dimensionally arranged integrated circuit. For example, such a semiconductor device includes vertically stacked and interconnected memory cells. However, as the integration of the three-dimensionally arranged memory cells increases, the process of forming these cells becomes increasingly difficult.

SUMMARY

Embodiments of the disclosure provide semiconductor devices capable of preventing deformation of a multilayer structure, an electronic system including the same, and a formation method thereof.

An embodiment of the disclosure provides a semiconductor device including: a horizontal wiring layer; a stack structure including a plurality of mold layers and a plurality of wiring layers alternately stacked on the horizontal wiring layer; a plurality of channel structures extending through the stack structure; and a plurality of separation patterns extending through the stack structure, wherein each of the plurality of separation patterns includes a plurality of first areas and a plurality of second areas adjacent to the plurality of first areas, wherein each of the plurality of first areas has a smaller width than each of the plurality of second areas.

An embodiment of the disclosure provides a semiconductor device including: a horizontal wiring layer; a stack structure including a plurality of mold layers and a plurality of wiring layers alternately stacked on the horizontal wiring layer; a lower support between the horizontal wiring layer and the stack structure; a sealing conductive layer between the horizontal wiring layer and the lower support; a plurality of channel structures extending into the horizontal wiring layer via the stack structure, the lower support and the sealing conductive layer; and a plurality of separation patterns intersecting the stack structure and extending into the horizontal wiring layer via the lower support and the sealing conductive layer, wherein a side surface of the lower support is misaligned with a side surface of the stack structure.

An embodiment of the disclosure provides an electronic system including: a semiconductor device; and a controller to control the semiconductor device, wherein the semiconductor device includes a horizontal wiring layer, a stack structure including a plurality of mold layers and a plurality of wiring layers alternately stacked on the horizontal wiring layer, a plurality of channel structures extending through the stack structure, and a plurality of separation patterns extending through the stack structure, wherein each of the plurality of separation patterns includes a plurality of first portions regularly arranged and having a smaller width than a plurality of second portions of the plurality of separation patterns, wherein the controller is electrically connected to the semiconductor device.

BRIEF DESCRIPTION OF THE DRAWINGS

FIGS. 12 to 21, FIGS. 24, 25, 26, 27, 28, 29, 30 and 31, FIG. 33, FIG. 36, and FIGS. 38, 39, 40, 41, 42, 43 and 44 are cross-sectional views of semiconductor device formation methods according to embodiments of the disclosure.

DETAILED DESCRIPTION OF THE EMBODIMENTS

Figure 1:
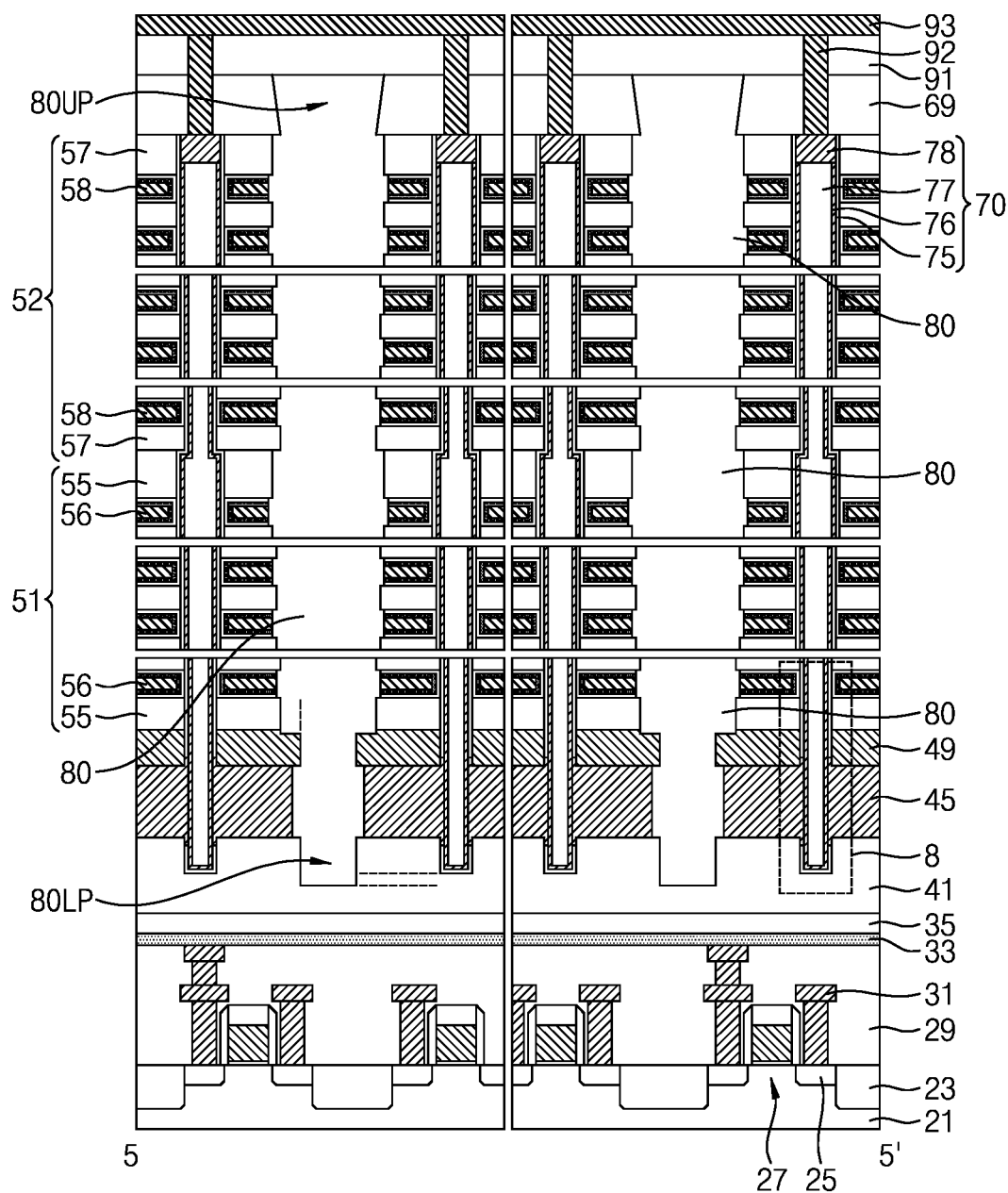
FIGS. 1 and 2 are cross-sectional views of semiconductor devices according to embodiments of the disclosure.
Figure 2:
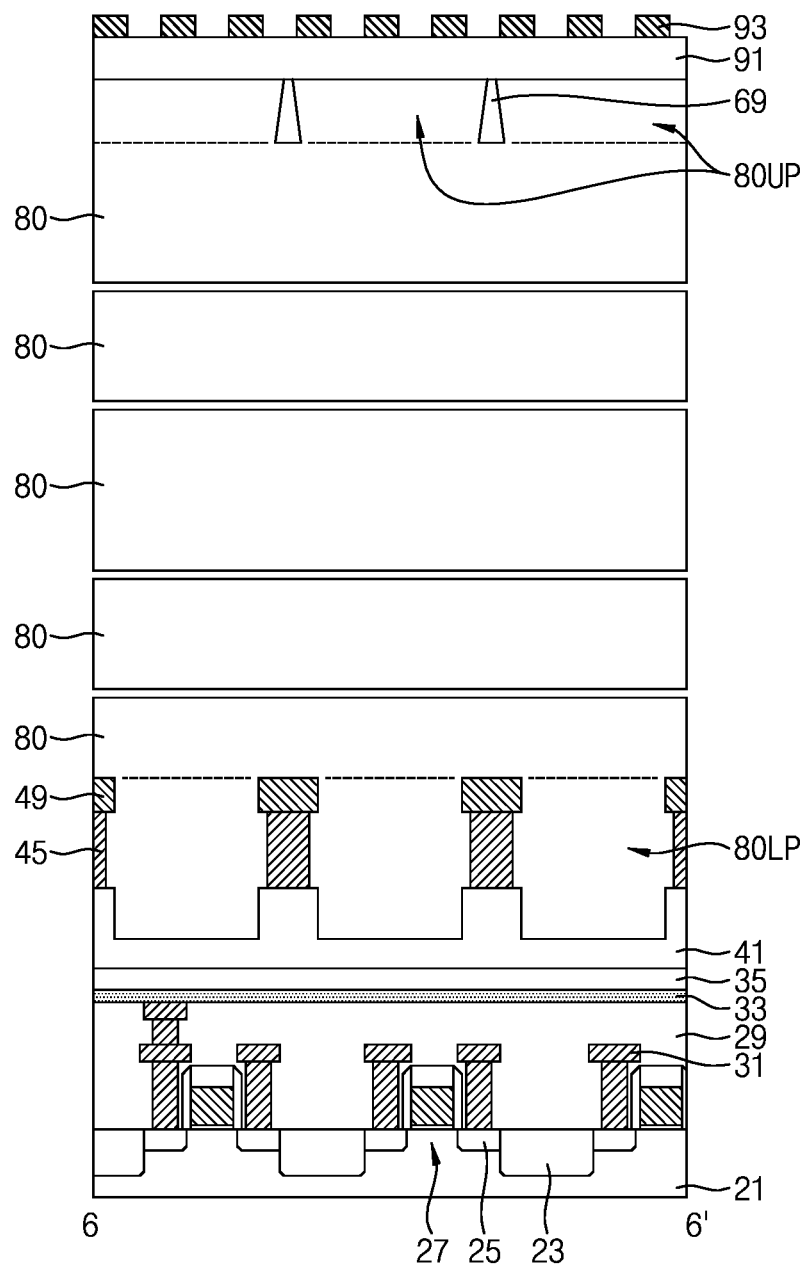
Figure 3:
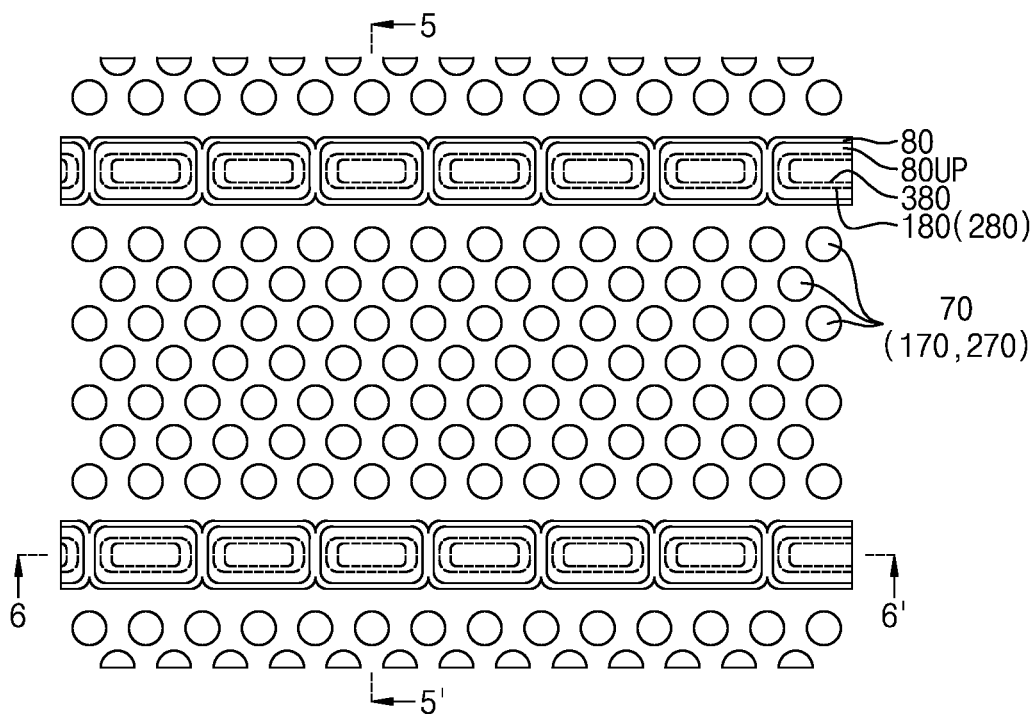
FIG. 3 is a layout of semiconductor devices according to embodiments of the disclosure.
Figure 4:
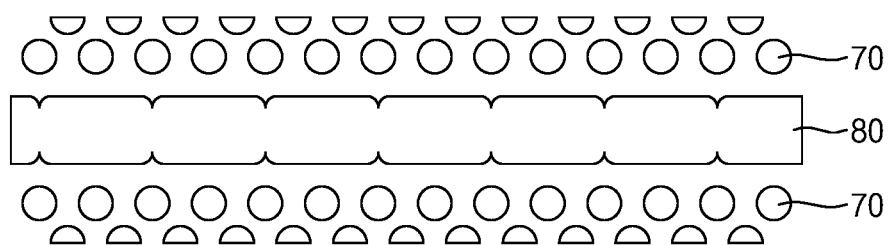
FIG. 4 is a partial view showing a portion of FIG. 3.
Figure 5:
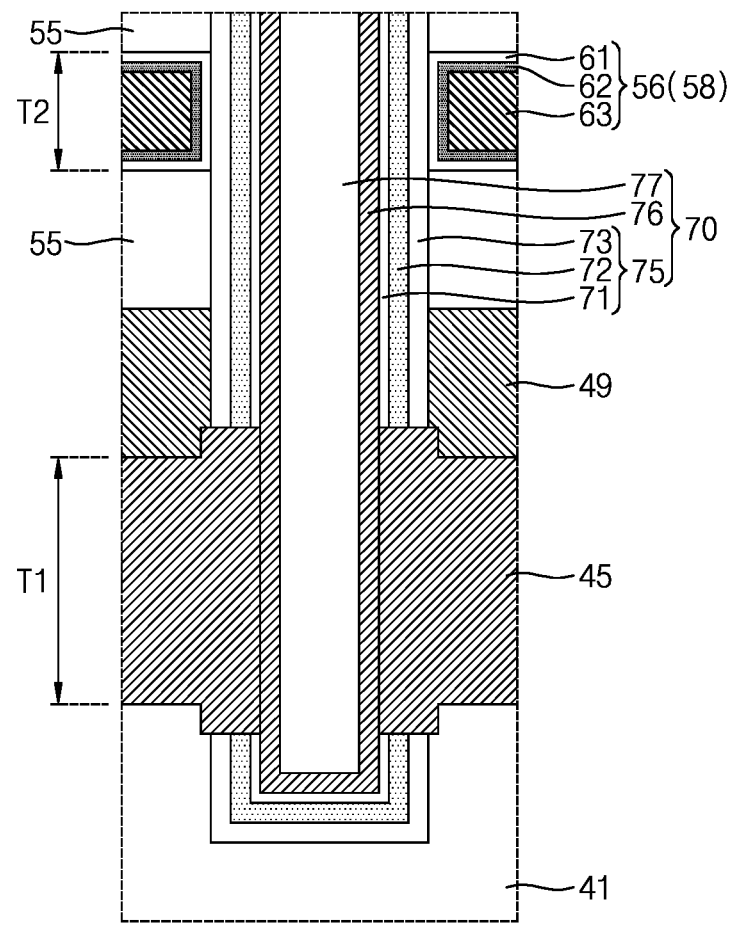
FIG. 5 is a partial view showing a portion of FIG. 1.

FIGS. 1 and 2 are cross-sectional views of semiconductor devices according to embodiments of the disclosure. FIG. 3 is a layout of semiconductor devices according to embodiments of the disclosure. FIG. 4 is a partial view showing a portion of FIG. 3. FIG. 5 is a partial view showing a portion 8 of FIG. 1. In an embodiment of the disclosure, FIG. 1 may be a cross-sectional view taken along line 5-5' in FIG. 3, and FIG. 2 may be a cross-sectional view taken along line 6-6' in FIG. 3. In an embodiment of the disclosure, the semiconductor devices may include a non-volatile memory such as vertical NAND (VNAND) or three-dimensional (3D) flash memory. The semiconductor devices according to the embodiments of the disclosure may also include a cell-on-peripheral (COP) structure.

Referring to FIG. 1, the semiconductor devices according to the embodiments of the disclosure may include a substrate 21, an element isolation layer 23, a plurality of impurity regions 25, a plurality of transistors 27, a first lower insulating layer 29, a plurality of peripheral circuit wiring layers 31, a second lower insulating layer 33, a third lower insulating layer 35, a horizontal wiring layer 41, a sealing conductive layer 45, a lower support 49, a first stack structure 51, a second stack structure 52, an upper support 69, a plurality of channel structures 70, a plurality of separation patterns 80, a first upper insulating layer 91, a plurality of bit plugs 92, and a plurality of bit lines 93.

The first stack structure 51 may include a plurality of first mold layers 55 and a plurality of first wiring layers 56 which are alternately stacked. The second stack structure 52 may include a plurality of second mold layers 57 and a plurality of second wiring layers 58 which are alternately stacked. Each of the plurality of channel structures 70 may include a core pattern 77, a channel layer 76 surrounding an outside of the core pattern 77, an information storage pattern 75 surrounding an outside of the channel layer 76, and a bit pad 78 on the channel layer 76. Each of the plurality of separation patterns 80 may include a plurality of downward protrusions 80LP and a plurality of upward protrusions 80UP.

The horizontal wiring layer 41 may correspond to a common source line. The plurality of first wiring layers 56 and the plurality of second wiring layers 58 may include a plurality of word lines. Each of the plurality of separation patterns 80 may correspond to a word line separation pattern. A plurality of non-volatile memory cells may be disposed at intersections of the plurality of first wiring layers 56 and the plurality of channel structures 70 and intersections of the plurality of second wiring layers 58 and the plurality of channel structures 70.

Referring to FIG. 2, the semiconductor devices according to the embodiments of the disclosure may include a substrate 21, an element isolation layer 23, a plurality of impurity regions 25, a plurality of transistors 27, a first lower insulating layer 29, a plurality of peripheral circuit wiring layers 31, a second lower insulating layer 33, a third lower insulating layer 35, a horizontal wiring layer 41, a sealing conductive layer 45, a lower support 49, an upper support 69, a separation pattern 80, a first upper insulating layer 91, and a plurality of bit lines 93. The separation pattern 80 may include a plurality of downward protrusions 80LP and a plurality of upward protrusions 80UP.

Referring to FIG. 3, the semiconductor devices according to the embodiments of the disclosure may include a plurality of channel structures 70 and a plurality of separation patterns 80. The plurality of channel structures 70 may be arranged in a row direction and a column direction. The plurality of separation patterns 80 may be parallel. For example, the plurality of separation patterns 80 may be parallel to each other.

Referring to FIG. 4, a separation pattern 80 may include a plurality of portions having a relatively small width. In an embodiment of the disclosure, the plurality of portions having the relatively small width may be repeatedly arranged. For example, the separation pattern 80 may have a first portion with a greater width than a second portion having the relatively small width. The second portion having the relatively small width may be disposed between adjacent first portions of the separation pattern 80. Each of the plurality of portions having the relatively small width may be aligned to be adjacent to a center of one of the plurality of channel structures 70. For example, when viewed in a plan view, the plurality of channel structures 70 may be arranged in a row direction and a column direction. A row of the channel structures 70 nearest to the separation pattern 80 may be parallel to the separation pattern 80. Each of the portions of the separation pattern 80 having the relatively small width may be aligned to be adjacent to a center of one of the plurality of channel structures 70 arranged in a row nearest to the separation pattern 80.

Referring to FIG. 5, each of the plurality of channel structures 70 may include a core pattern 77, a channel layer 76, and an information storage pattern 75. The information storage pattern 75 may include a tunnel insulating layer 71 surrounding an outside of the channel layer 76, a charge storage layer 72 surrounding an outside of the tunnel insulating layer 71, and a first blocking layer 73 surrounding an outside of the charge storage layer 72.

The tunnel insulating layer 71 may include an insulating layer such as silicon oxide. The charge storage layer 72 may include an insulating layer such as silicon nitride. The first blocking layer 73 may include an insulating layer such as silicon oxide, silicon nitride, silicon oxynitride, high-k dielectrics (for example, a metal oxide such as HfO, AlO, or a combination thereof, or a metal silicate such as HfSiO), or a combination thereof. The channel layer 76 may include a semiconductor layer such as polysilicon, amorphous silicon, monocrystalline silicon, or a combination thereof. The core pattern 77 may include silicon oxide, silicon nitride, silicon oxynitride, low-k dielectrics, high-k dielectrics, polysilicon, or a combination thereof.

Each of the plurality of first wiring layers 56 may include a second blocking layer 61, a barrier layer 62, and an electrode layer 63. The barrier layer 62 may be formed outside the electrode layer 63. The second blocking layer 61 may be formed outside the barrier layer 62. Each of the plurality of second wiring layers 58 may include substantially the same configuration as the first wiring layer 56. In an embodiment of the disclosure, each of the plurality of second wiring layers 58 may include a material layer identical to that of the first wiring layer 56 while being formed simultaneously with that of the first wiring layer 56.

The second blocking layer 61 may include silicon oxide, silicon nitride, silicon oxynitride, silicon boron nitride (SiBN), silicon carbon nitride (SiCN), low-k dielectrics, high-k dielectrics (for example, a metal oxide such as HfO or AlO, a metal silicate such as HfSiO, etc.), or a combination thereof. In an embodiment of the disclosure, the second blocking layer 61 may include an aluminum oxide layer.

The barrier layer 62 and the electrode layer 63 may include a conductive material such as metal, metal nitride, metal oxide, metal silicide, conductive carbon, polysilicon, amorphous silicon, monocrystalline silicon, or a combination thereof. In an embodiment of the disclosure, the barrier layer 62 may include Ti, TiN, Ta, TaN, or a combination thereof. The electrode layer 63 may include W, WN, Ti, TiN, Ta, TaN, Co, Ni, Ru, Pt, polysilicon, conductive carbon, or a combination thereof.

The sealing conductive layer 45 may have a first thickness T1. Each of the plurality of first wiring layers 56 may have a second thickness T2. The first thickness T1 may be greater than the second thickness T2. The first thickness T1 may be 1.2 to 5 times the second thickness T2. The first thickness T1 may be about 2 times the second thickness T2. The sealing conductive layer 45 may have a portion with a thickness greater than that of the first thickness T1. This portion of the sealing conductive 45 may be located adjacent to the channel structure 70.

Again referring to FIGS. 1 to 5, the substrate 21 may include a semiconductor substrate such as a silicon wafer or a silicon-on-insulator (SOI) wafer. The element isolation layer 23 may be formed on the substrate 21. The plurality of impurity regions 25 may be formed in the substrate 21. Each of the plurality of impurity regions 25 may include N-type or P-type impurities.

The plurality of transistors 27 may be formed in the substrate 21 and/or on the substrate 21 in accordance with various methods. The plurality of transistors 27 may include a fin field effect transistor (FinFET), a multi-bridge channel transistor such as MBCFET®, a nanowire transistor, a vertical transistor, a recess channel transistor, a 3-D transistor, a planar transistor, or a combination thereof. The plurality of transistors 27 may include some of the plurality of impurity regions 25. Some of the plurality of impurity regions 25 may correspond to a drain region or a source region of the plurality of transistors 27.

The first lower insulating layer 29 may be formed on the substrate 21 to cover the plurality of transistors 27 and the element isolation layer 23. The plurality of peripheral circuit wirings 31 may be formed in the first lower insulating layer 29. The plurality of peripheral circuit wiring layers 31 may include horizontal and vertical wirings having various shapes. Some of the plurality of peripheral circuit wirings 31 may directly contact the plurality of impurity regions 25. The plurality of transistors 27 and the plurality of peripheral circuit wiring layers 31 may constitute a peripheral circuit. The second lower insulating layer 33 may be formed on the first lower insulating layer 29 and the plurality of peripheral circuit wirings 31. The third lower insulating layer 35 may be formed on the second lower insulating layer 33.

Each of the element isolation layer 23, the first lower insulating layer 29, the second lower insulating layer 33 and the third lower insulating layer 35 may include a single layer or multiple layers. Each of the element isolation layer 23, the first lower insulating layer 29, the second lower insulating layer 33 and the third lower insulating layer 35 may include silicon oxide, silicon nitride, silicon oxynitride, silicon boron nitride (SiBN), silicon carbon nitride (SiCN), low-k dielectrics, high-k dielectrics, or a combination thereof. The second lower insulating layer 33 may correspond to a capping layer or an etch stop layer. The second lower insulating layer 33 may include a material different from those of the first lower insulating layer 29 and the third lower insulating layer 35. For example, the second lower insulating layer 33 may include silicon nitride, silicon oxynitride, silicon boron nitride (SiBN), silicon carbon nitride (SiCN), or a combination thereof. The first lower insulating layer 29 and the third insulating layer 35 may include silicon oxide.

The plurality of peripheral circuit wiring layers 31 may include a single layer or multiple layers. The plurality of peripheral circuit wiring layers 31 may include a conductive material such as metal, metal nitride, metal oxide, metal silicide, conductive carbon, polysilicon, amorphous silicon, monocrystalline silicon, or a combination thereof.

In an embodiment of the disclosure, the horizontal wiring layer 41 may be disposed on the third lower insulating layer 35. The sealing conductive layer 45 may be disposed on the horizontal wiring layer 41. The lower support 49 may be disposed on the sealing conductive layer 45. The first stack structure 51 may be disposed on the lower support 49. The second stack structure 52 may be disposed on the first stack structure 51.

The plurality of channel structures 70 may be disposed to extend into the horizontal wiring layer 41 while extending vertically through the second stack structure 52, the first stack structure 51, the lower support 49 and the sealing conductive layer 45. Upper surfaces of the second stack structure 52 and the plurality of channel structures 70 may be substantially coplanar. The upper support 69 may be disposed on the second stack structure 52 and the plurality of channel structures 70.

The plurality of separation patterns 80 may be disposed to extend into the horizontal wiring layer 41 while extending vertically through the upper support 69, the second stack structure 52, the first stack structure 51, the lower support 49 and the sealing conductive layer 45. For example, the plurality of downward protrusions 80LP of the plurality of separation patterns 80 may extend into the horizontal wiring layer 41. The plurality of separation patterns 80 may be parallel to each other. When viewed in a plan view, each of the plurality of separation patterns 80 may intersect the second stack structure 52 and the first stack structure 51.

The plurality of downward protrusions 80LP may be in continuity with the plurality of separation patterns 80. In other words, the plurality of downward protrusions 80LP are a part of the plurality of separation patterns 80. The plurality of downward protrusions 80LP may extend into the horizontal wiring layer 41 while extending vertically through the lower support 49 and the sealing conductive layer 45. In this case, plurality of downward protrusions 80LP constitutes a portion of the plurality of separation patterns 80 disposed in the horizontal wiring layer 41, the lower support 49 and the sealing conductive layer 45. The distance between a lowermost end of each of the plurality of downward protrusions 80LP and a lower surface of the horizontal wiring layer 41 may be smaller than the distance between a lowermost end of each of the plurality of channel structures 70 and the lower surface of the horizontal wiring layer 41.

A side surface of the lower support 49 may be disposed to be misaligned from side surfaces of the first stack structure 51 and the second stack structure 52. For example, the first stack structure 51 and the second stack structure 52 may include a first section disposed between one pair of the plurality of separation patterns 80, and the lower support 49 may include a second section disposed between one pair of the plurality of separation patterns 80. A maximum horizontal width of the first section may be smaller than a maximum horizontal width of the second section. In other words, the portion of the plurality of separation patterns 80 between the lower support 49 is narrower than the portion of the plurality of separation patterns 80 between the first stack structure 51 and the second stack structure 52. The plurality of separation patterns 80 may contact side and upper surfaces of the lower support 49.

In an embodiment of the disclosure, a selected one of the plurality of separation patterns 80 may include the plurality of downward protrusions 80LP extending into the horizontal wiring layer 41 while extending through the lower support 49 and the sealing conductive layer 45. The lower support 49 and the sealing conductive layer 45 may extend into an area occupied by the plurality of downward protrusions 80LP, thereby decreasing the width of the plurality of downward protrusions 80LP.

The plurality of upward protrusions 80UP may be in continuity with the plurality of separation patterns 80. The plurality of upward protrusions 80UP may extend vertically through the upper support 69. Upper surfaces of the upper support 69 and the plurality of upward protrusions 80UP may be substantially coplanar. In an embodiment of the disclosure, a selected one of the plurality of separation patterns 80 may include the plurality of upward protrusions 80UP extending through the upper support 69. The upper support 69 may extend into an area occupied by the plurality of upward protrusions 80UP.

The first upper insulating layer 91 may be disposed on the upper support 69 and the plurality of separation patterns 80. The plurality of bit plugs 92 may be disposed to contact the bit pad 78 while extending through the first upper insulating layer 91 and the upper support 69. The plurality of bit lines 93 may be disposed on the first upper insulating layer 91, to contact the plurality of bit plugs 92.

FIGS. 6 to 9 are cross-sectional views of semiconductor devices according to embodiments of the disclosure. In an embodiment of the disclosure, FIGS. 6 and 7 may be cross-sectional views taken along line 5-5' in FIG. 3, and FIG. 9 may be a cross-sectional view taken along line 6-6' in FIG. 3.

Figure 6:
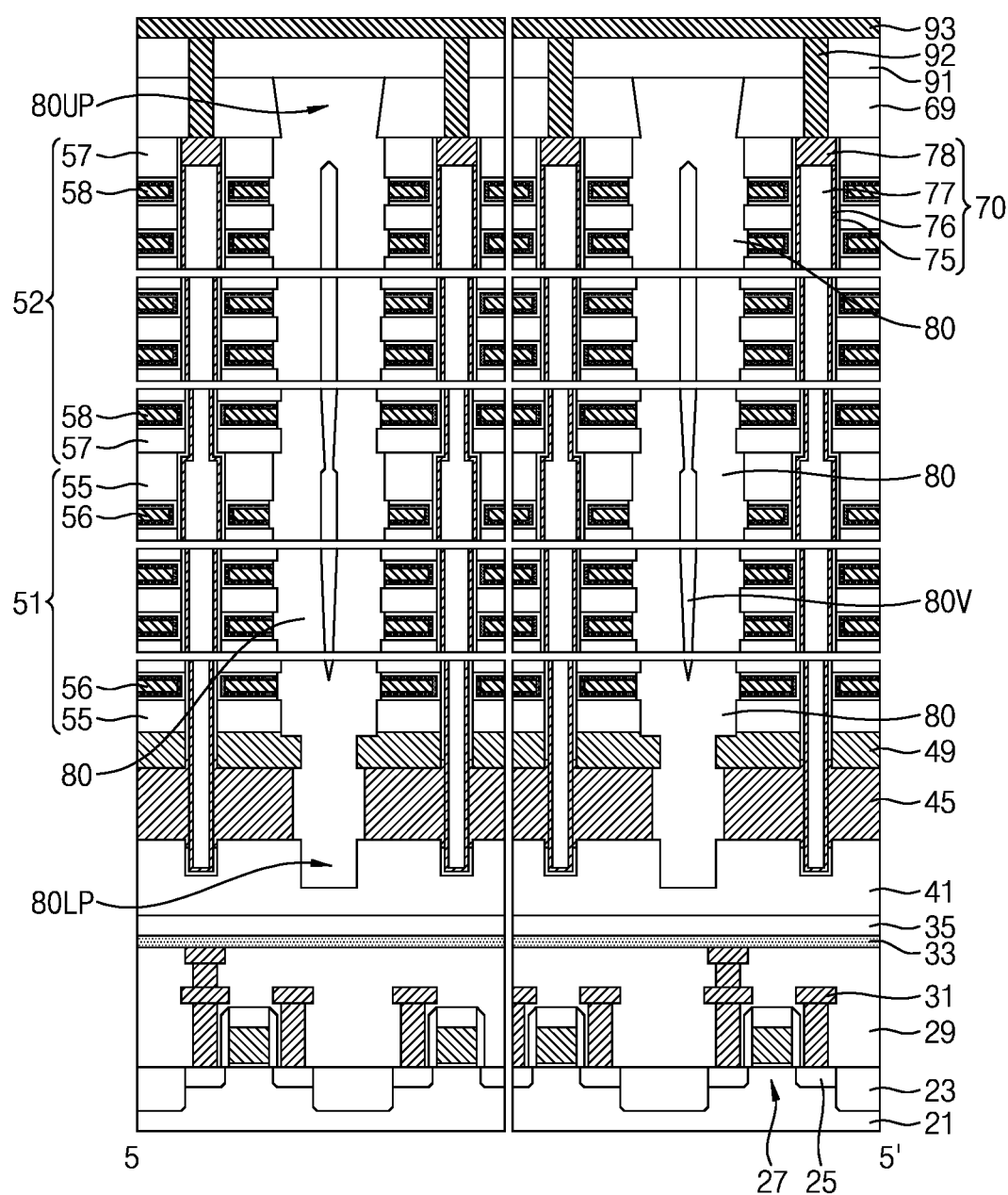
FIGS. 6, 7, 8 and 9 are cross-sectional views of semiconductor devices according to embodiments of the disclosure.

Referring to FIG. 6, the semiconductor devices according to the embodiments of the disclosure may include a substrate 21, an element isolation layer 23, a plurality of impurity regions 25, a plurality of transistors 27, a first lower insulating layer 29, a plurality of peripheral circuit wiring layers 31, a second lower insulating layer 33, a third lower insulating layer 35, a horizontal wiring layer 41, a sealing conductive layer 45, a lower support 49, a first stack structure 51, a second stack structure 52, a plurality of channel structures 70, an upper support 69, a plurality of separation patterns 80, a first upper insulating layer 91, a plurality of bit plugs 92, and a plurality of bit lines 93. Each of the plurality of separation patterns 80 may include a void 80V formed adjacent to a center thereof.

Figure 7:
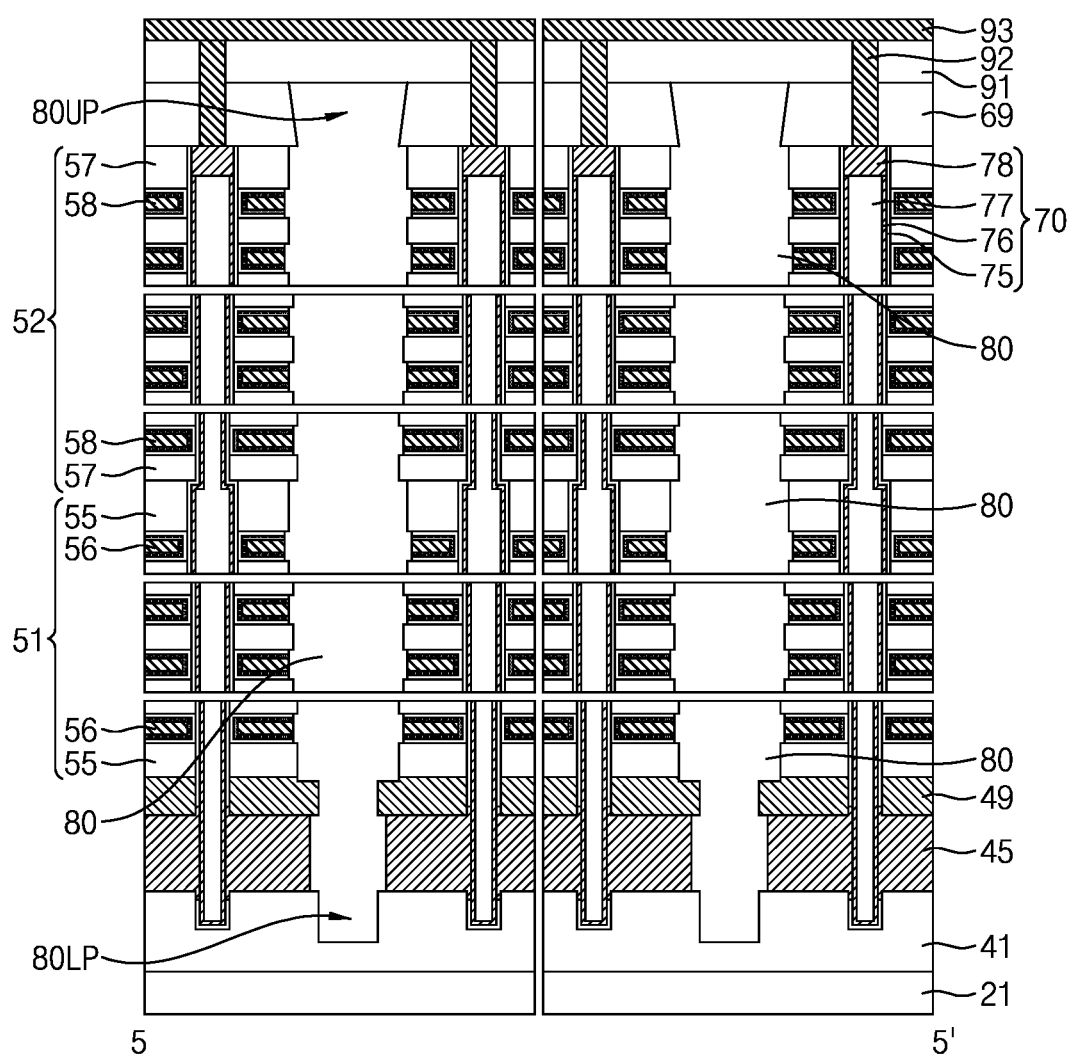

Referring to FIG. 7, the semiconductor devices according to the embodiments of the disclosure may include a substrate 21, a horizontal wiring layer 41, a sealing conductive layer 45, a lower support 49, a first stack structure 51, a second stack structure 52, a plurality of channel structures 70, an upper support 69, a plurality of separation patterns 80, a first upper insulating layer 91, a plurality of bit plugs 92, and a plurality of bit lines 93. In an embodiment of the disclosure, the horizontal wiring layer 41 may be formed through implantation of impurities in a region adjacent to an upper surface of the substrate 21. For example, the substrate 21 may include a monocrystalline silicon layer including P-type impurities. The horizontal wiring layer 41 may include a monocrystalline silicon layer including N-type impurities.

Figure 8:
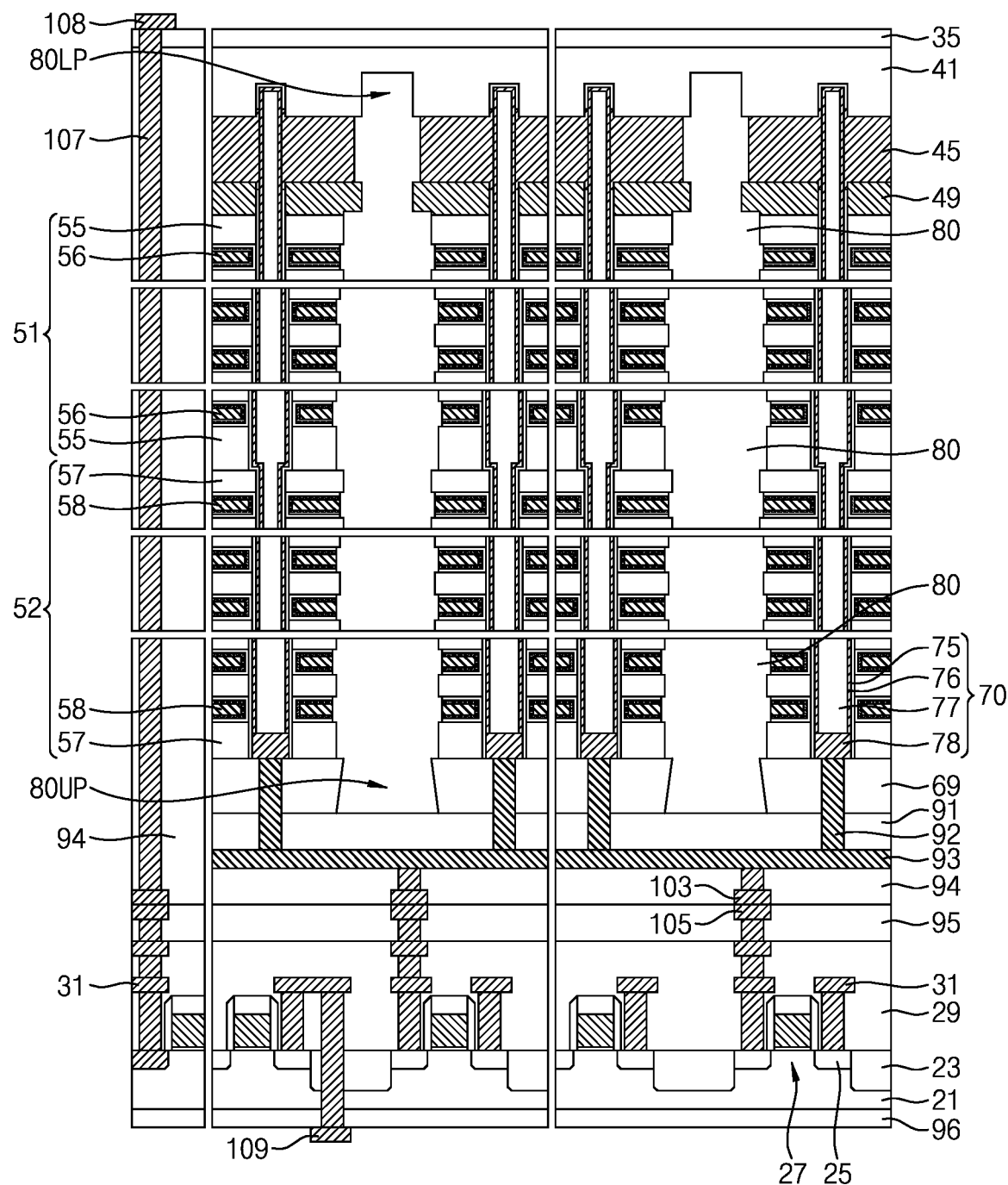

Referring to FIG. 8, the semiconductor devices according to the embodiments of the disclosure may include a substrate 21, an element isolation layer 23, a plurality of impurity regions 25, a plurality of transistors 27, a first lower insulating layer 29, a plurality of peripheral circuit wiring layers 31, a third lower insulating layer 35, a horizontal wiring layer 41, a sealing conductive layer 45, a lower support 49, a first stack structure 51, a second stack structure 52, a plurality of channel structures 70, an upper support 69, a plurality of separation patterns 80, a first upper insulating layer 91, a plurality of bit plugs 92, a plurality of bit lines 93, a first interlayer insulating layer 94, a second interlayer insulating layer 95, a backside insulating layer 96, a plurality of first bonding structures 103, a plurality of second bonding structures 105, a through electrode 107, a first external pad 108, and a second external pad 109.

Each of the first interlayer insulating layer 94, the second interlayer insulating layer 95 and the backside insulating layer 96 may include silicon oxide, silicon nitride, silicon oxynitride, low-k dielectrics, or high-k dielectrics. Each of the first interlayer insulating layer 94, the second interlayer insulating layer 95 and the backside insulating layer 96 may be a single layer or multiple layers. Each of the plurality of first bonding structures 103, the plurality of second bonding structures 105, the through electrode 107, the first external pad 108 and the second external pad 109 may include a conductive material such as metal, metal nitride, metal oxide, metal silicide, conductive carbon, or a combination thereof.

The backside insulating layer 96 may cover a lower surface of the substrate 21. The second external pad 109 may be formed on the backside insulating layer 96. The second external pad 109 may be connected to the plurality of peripheral circuit wiring layers 31 while extending through the backside insulating layer 96 and the substrate 21. The second interlayer insulating layer 95 may be formed on the first lower insulating layer 29. The plurality of second bonding structures 105 may be disposed in the second interlayer insulating layer 95. Each of the plurality of second bonding structures 105 may be connected to a corresponding one of the plurality of peripheral circuit wiring layers 31. Upper surfaces of the plurality of second bonding structures 105 and the second interlayer insulating layer 95 may be substantially coplanar.

The first interlayer insulating layer 94 may cover one surface of the plurality of bit lines 93. The plurality of first bonding structures 103 may be formed in the first interlayer insulating layer 94. Each of the plurality of bit lines 93 may be connected to a corresponding one of the plurality of first bonding structures 103. Lower surfaces of the plurality of first bonding structures 103 and the first interlayer insulating layer 94 may be substantially coplanar.

The plurality of bonding structures 103 and the first interlayer insulating layer 94 may be bonded to corresponding ones of the plurality of second bonding structures 105 and the second interlayer insulating layer 95. The plurality of first bonding structures 103 may be bonded to the plurality of second bonding structures 105 in a wafer bonding manner. Each of the plurality of first bonding structures 103 and the plurality of second bonding structures 105 may include, for example, copper (Cu). Each of the first interlayer insulating layer 94 and the second interlayer insulating layer 95 may include, for example, silicon oxide.

The first external pad 108 may be disposed on the third lower insulating layer 35. The first external pad 108 may be connected to the through electrode 107 which extends through the first interlayer insulating layer 94. The first external pad 108 may be connected to the plurality of peripheral circuit wiring layers 31 via the through electrode 107. A selected one of the first external pad 108 and the second external pad 109 may be omitted.

Figure 9:
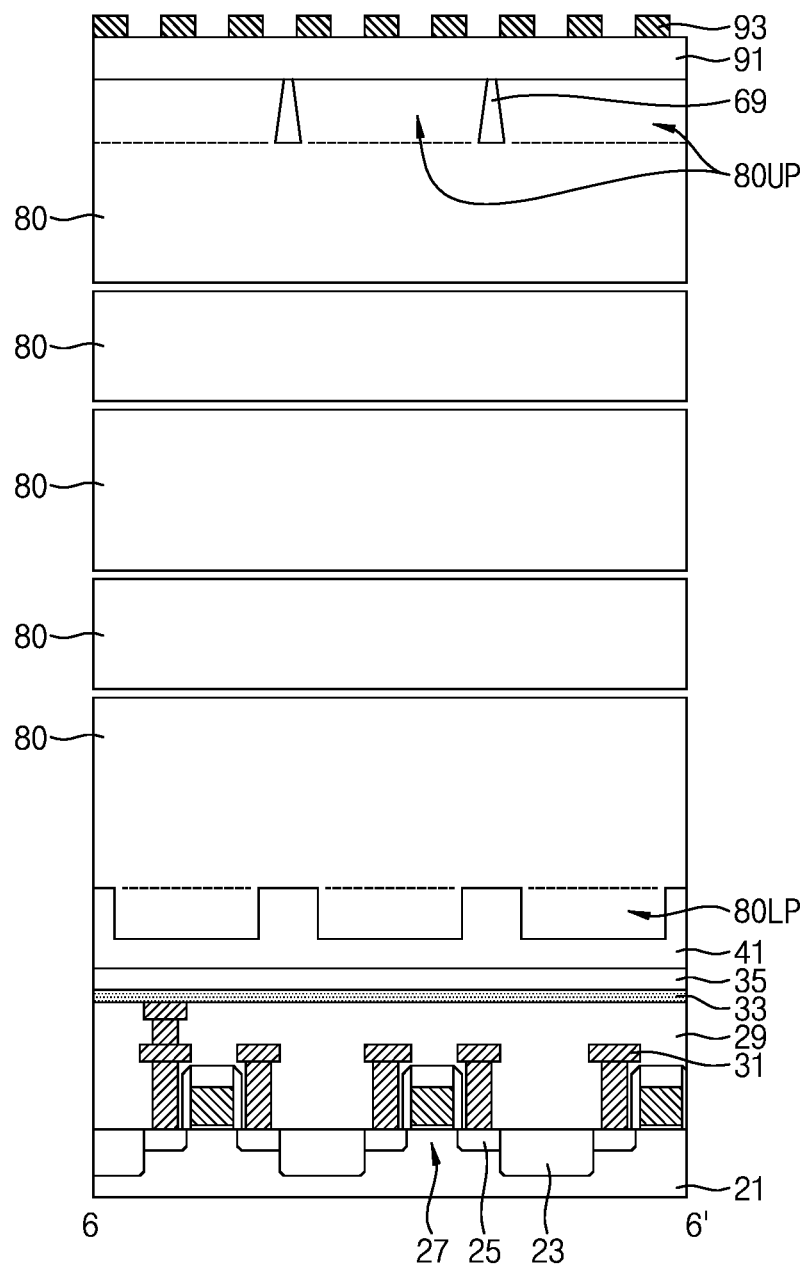

Referring to FIG. 9, the semiconductor devices according to the embodiments of the disclosure may include a substrate 21, an element isolation layer 23, a plurality of impurity regions 25, a plurality of transistors 27, a first lower insulating layer 29, a plurality of peripheral circuit wiring layers 31, a second lower insulating layer 33, a third lower insulating layer 35, a horizontal wiring layer 41, an upper support 69, a separation pattern 80, a first upper insulating layer 91, and a plurality of bit lines 93. The separation pattern 80 may include a plurality of downward protrusions 80LP and a plurality of upward protrusions 80UP. The downward protrusion 80LP may be rectangular shaped and the upward protrusion 80UP may have a tapered shape.

In an embodiment of the disclosure, the sealing conductive layer ("45" in FIG. 2) and the lower support ("49" in FIG. 2) may be locally removed. Lower surfaces of the plurality of downward protrusions 80LP may extend into the horizontal wiring layer 41. The lower surfaces of the plurality of downward protrusions 80LP may be formed at a lower level than an uppermost end of the horizontal wiring layer 41.

Figure 10:
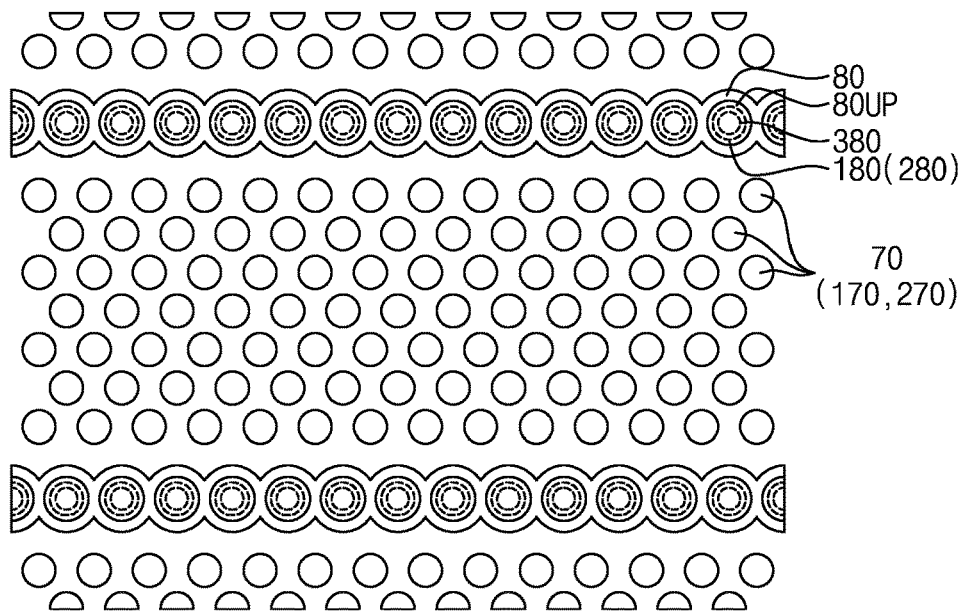
FIG. 10 is a layout of semiconductor devices according to embodiments of the disclosure.

FIG. 10 is a layout of semiconductor devices according to embodiments of the disclosure.

Referring to FIG. 10, the semiconductor devices according to the embodiments of the disclosure may include a plurality of channel structures 70 and a plurality of separation patterns 80. The plurality of separation patterns 80 may have various shapes. In an embodiment of the disclosure, the plurality of separation patterns 80 may include a shape similar to a combination of circles having a greater diameter than each of the plurality of channel structures 70.

Figure 11:
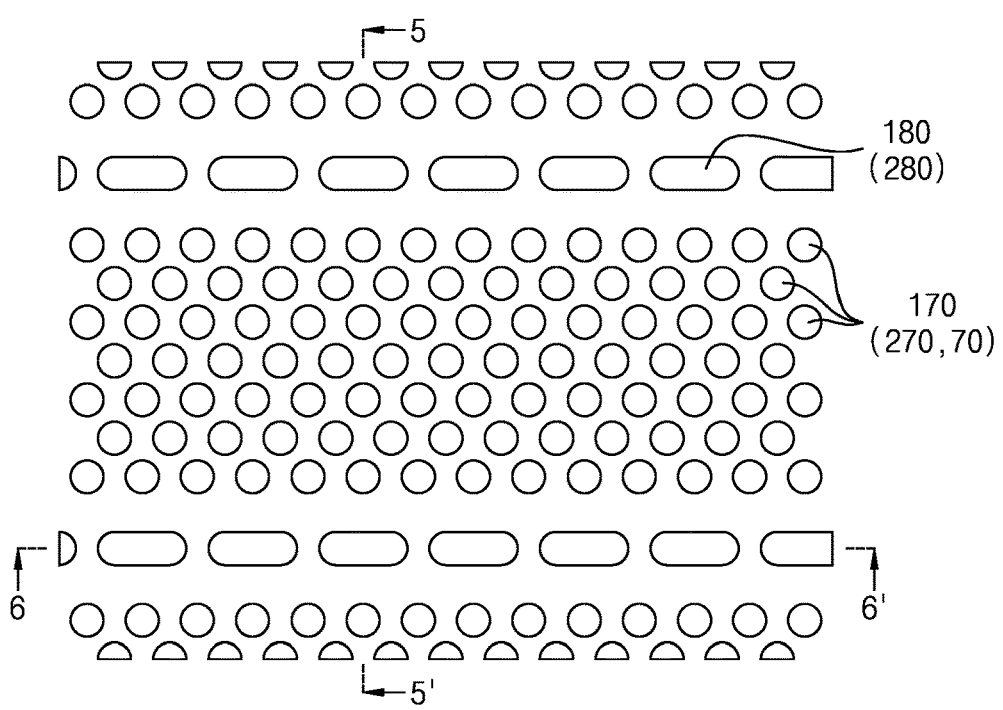
FIGS. 11, 12, 13, 14, 15, 16, 17, 18, 19, 20, 21 and 22 are layouts of semiconductor device formation methods according to embodiments of the disclosure.
Figure 21:
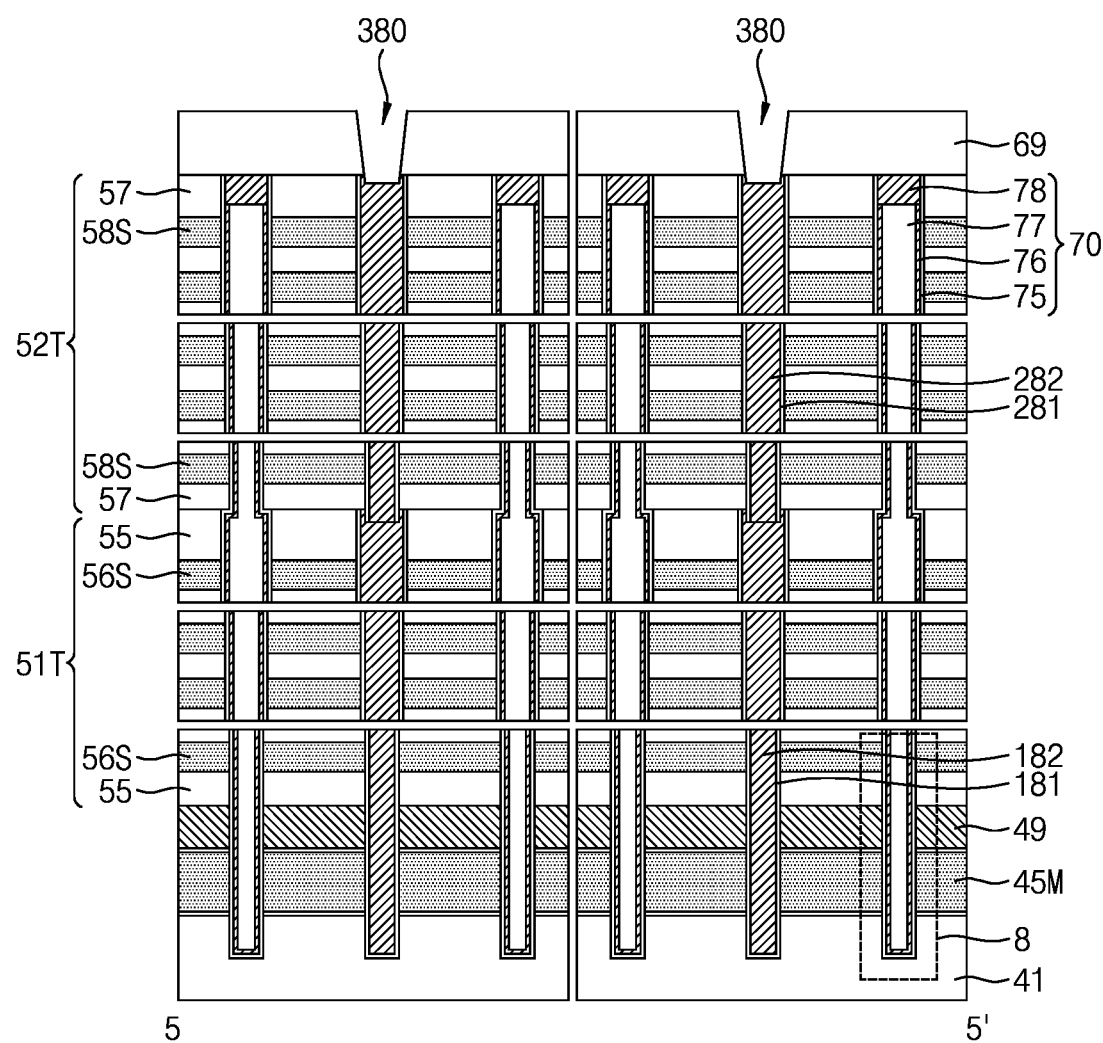
Figure 22:
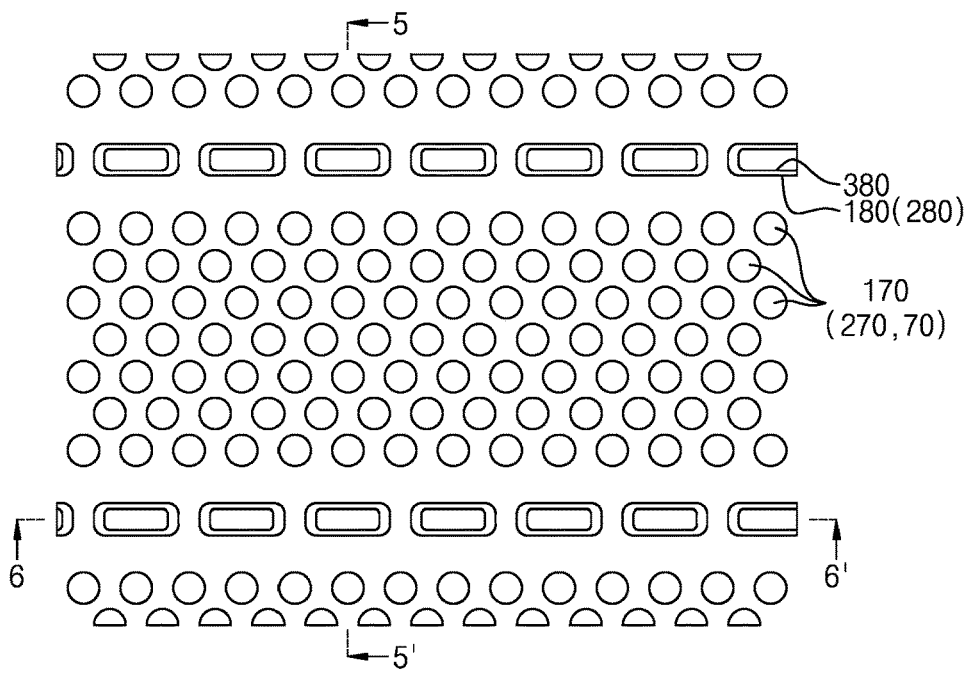
Figure 23:
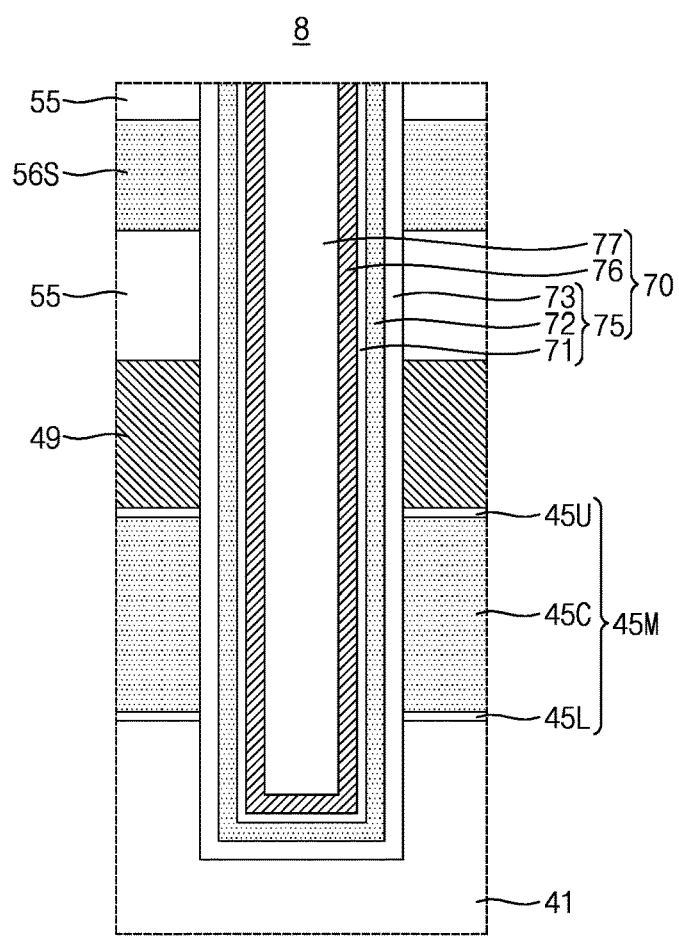
FIGS. 23, 32, 34, 35 and 37 are partial views.
Figure 24:
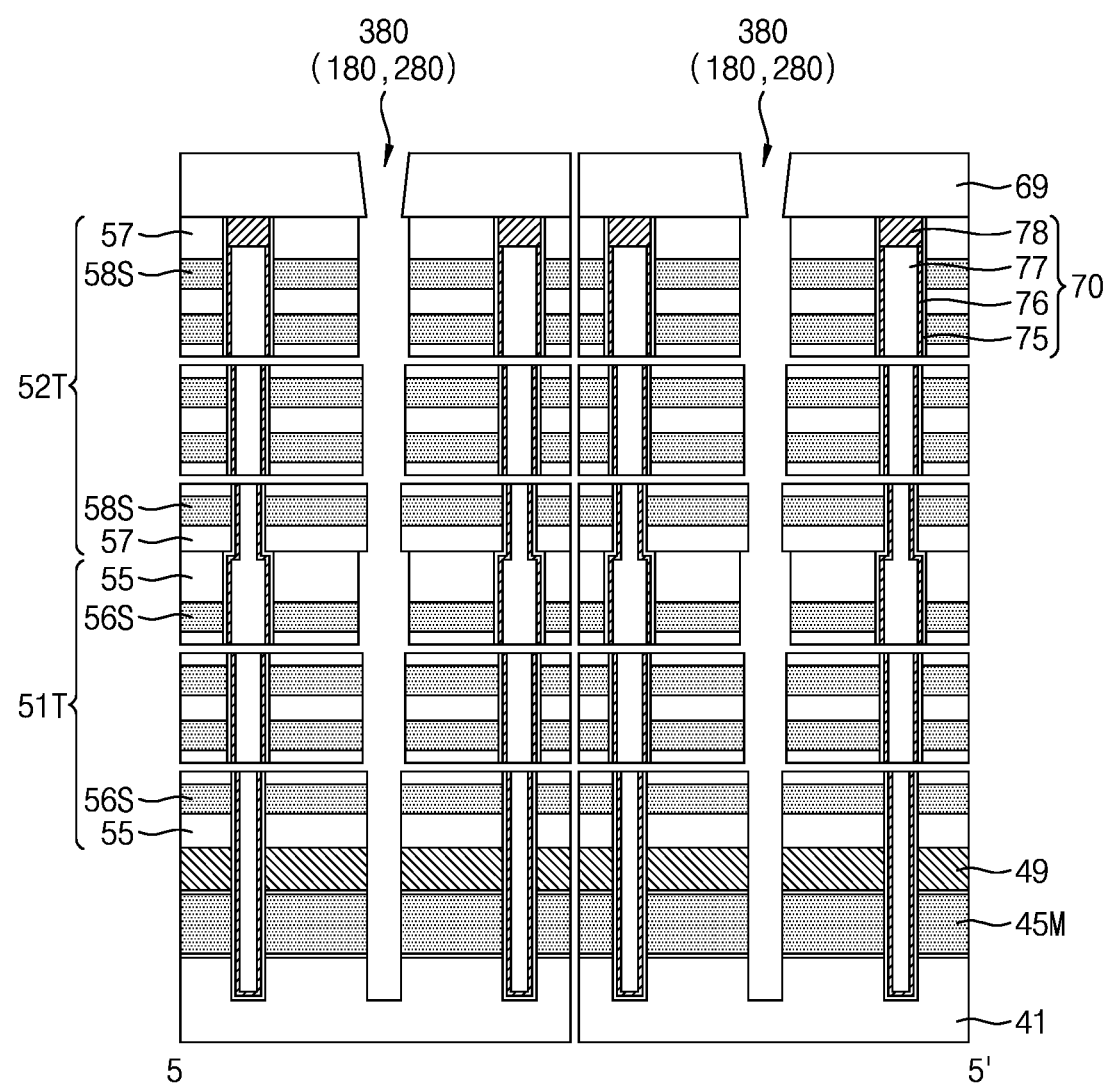
Figure 25:
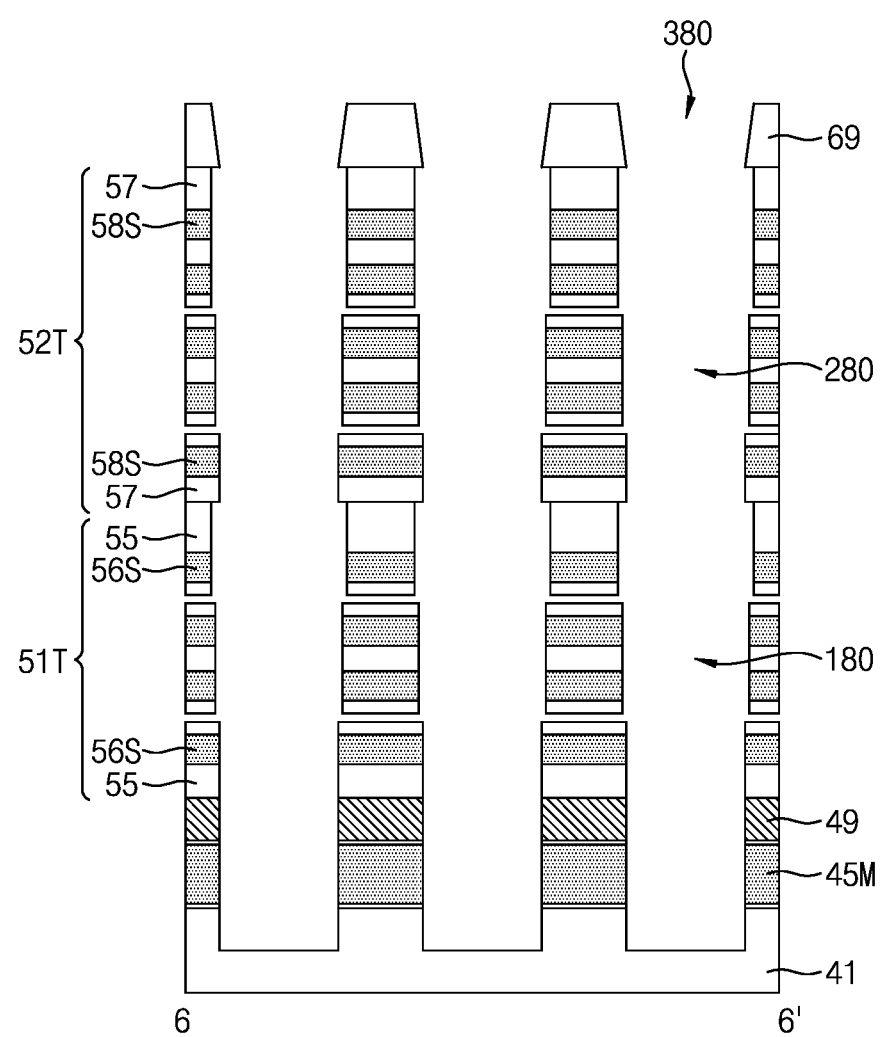
Figure 31:
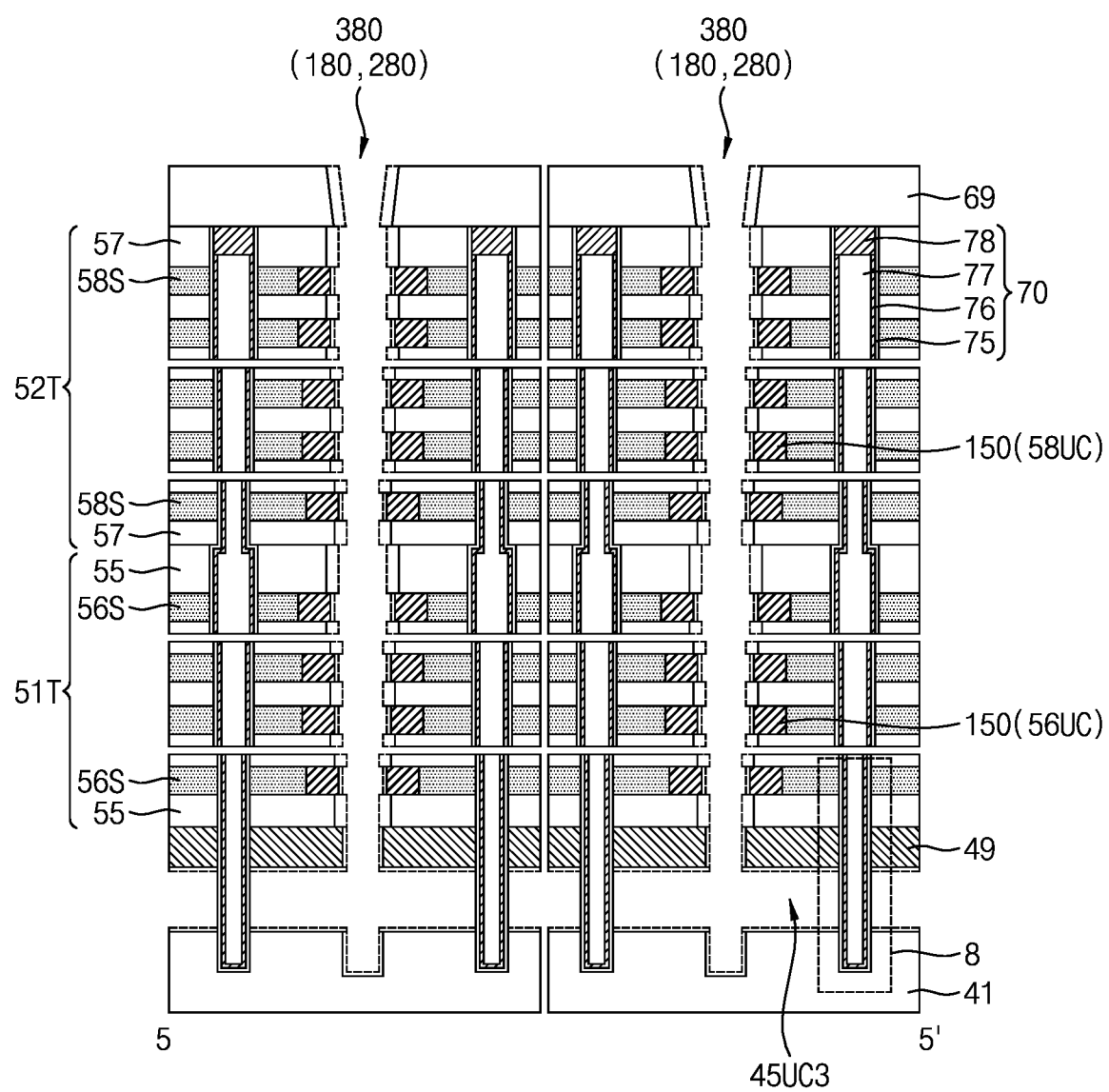
Figure 32:
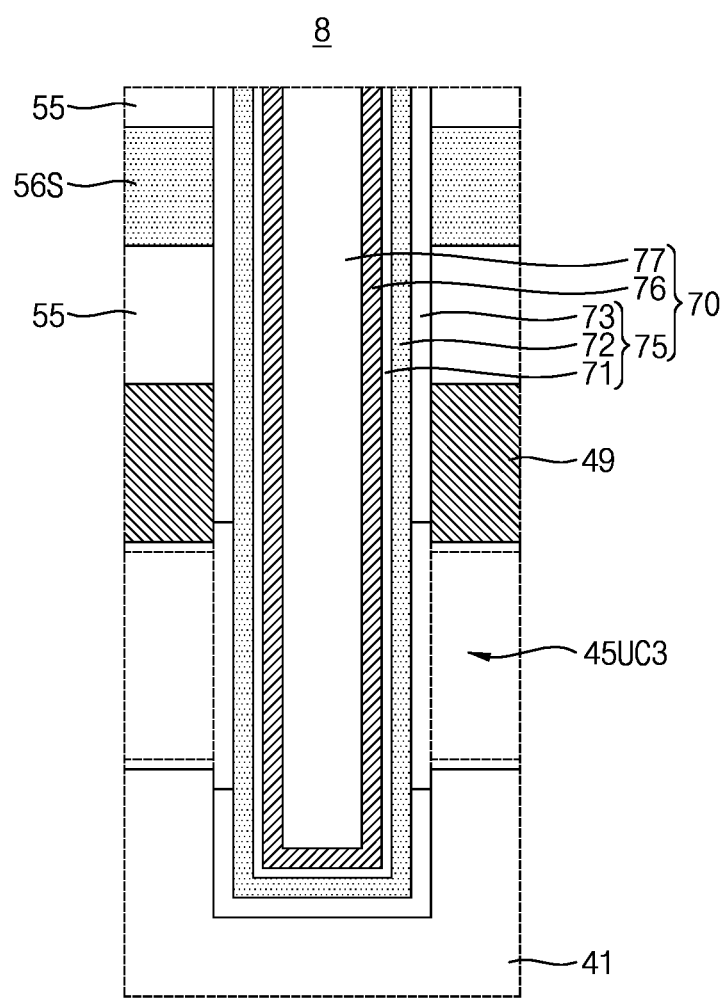
Figure 33:
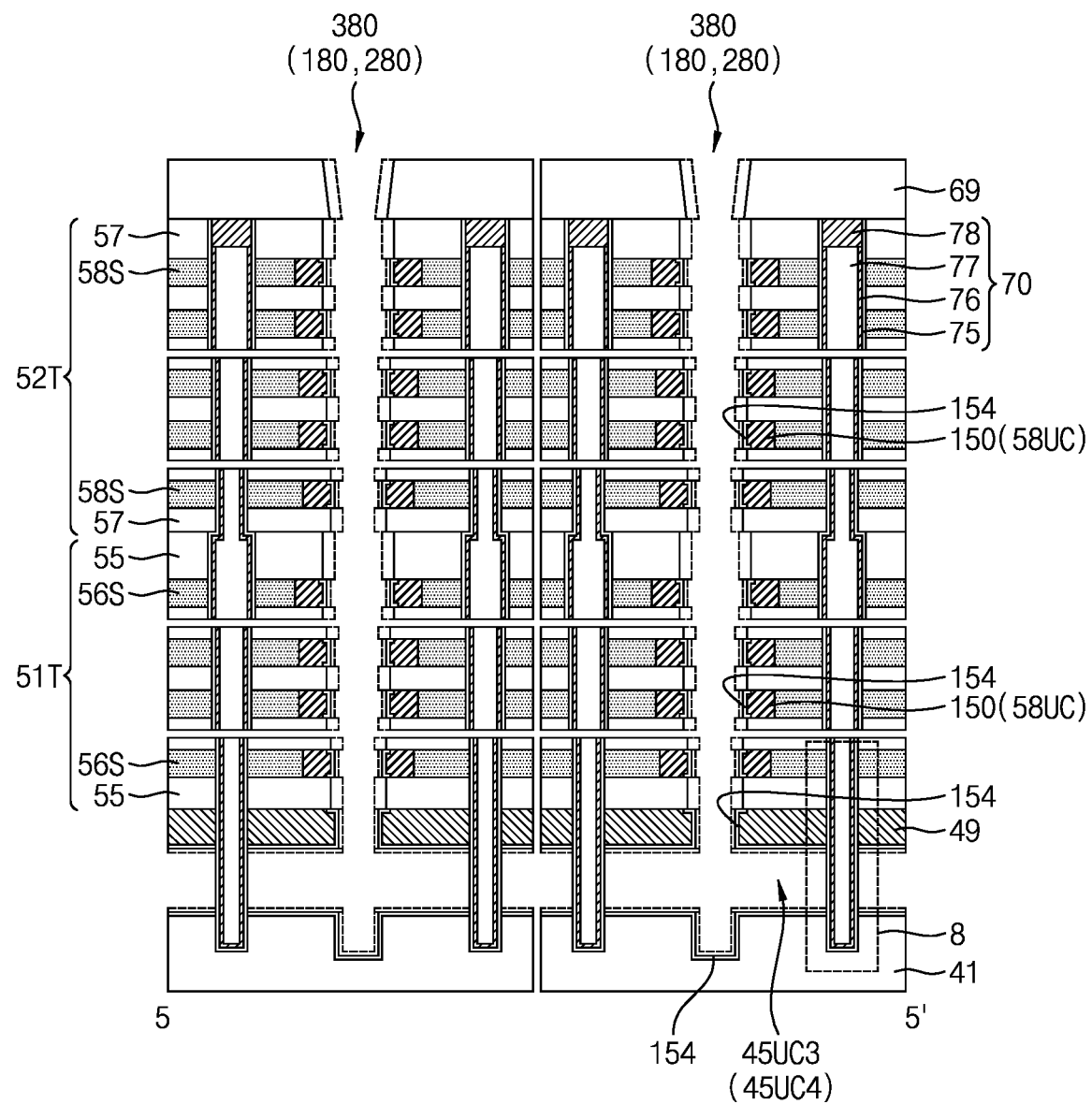
Figure 34:
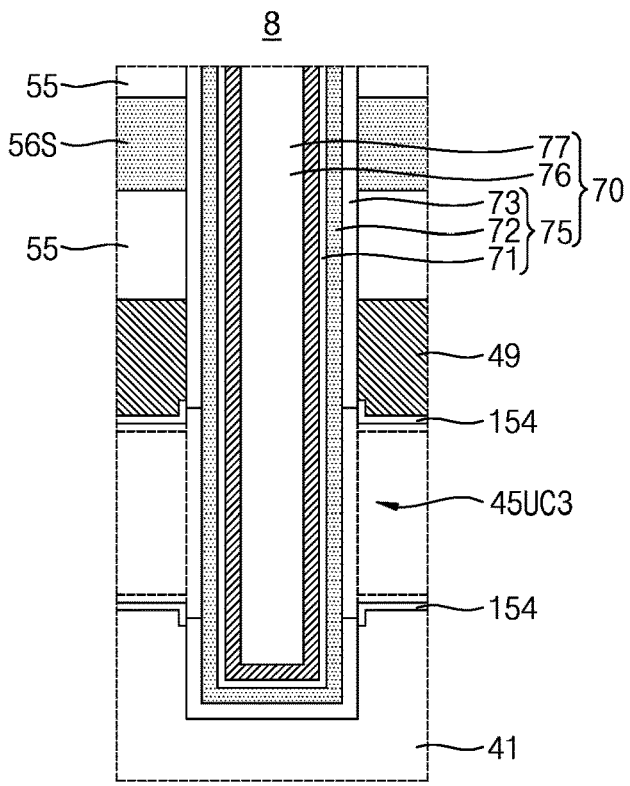
Figure 35:
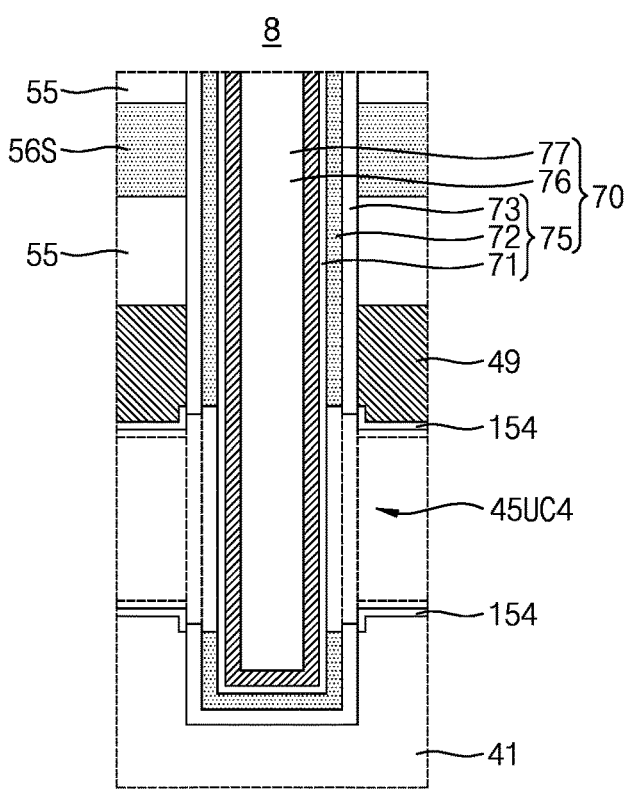
Figure 36:
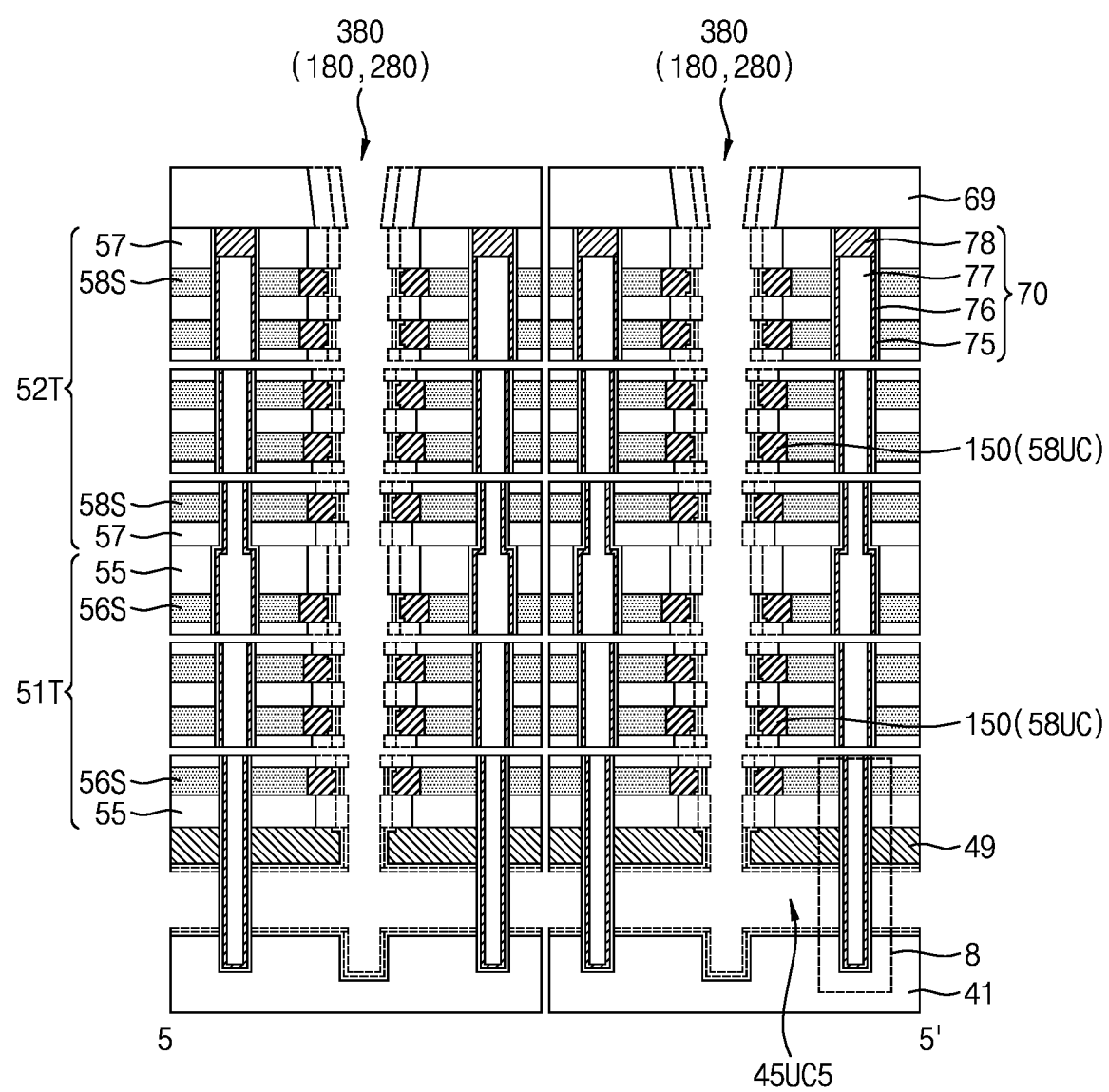
Figure 37:
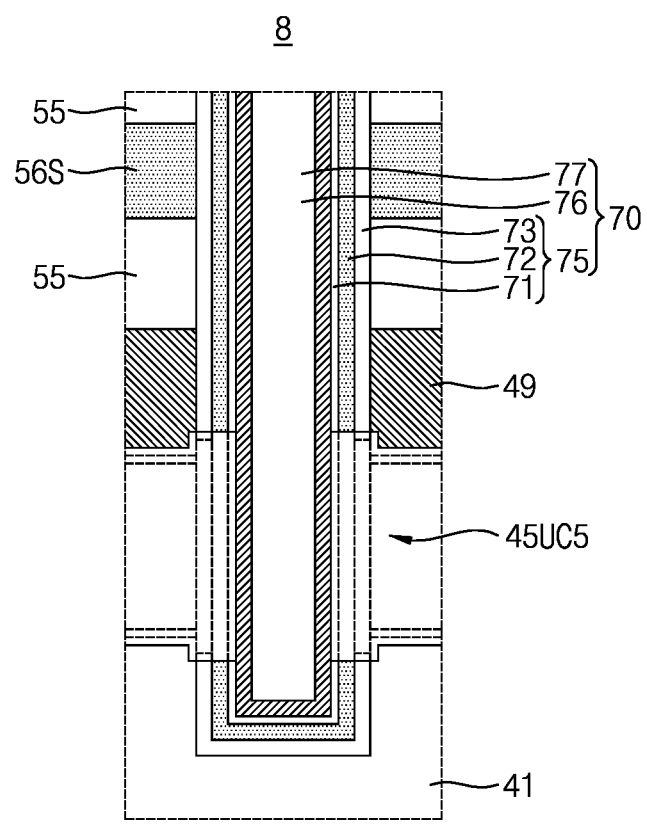
Figure 44:
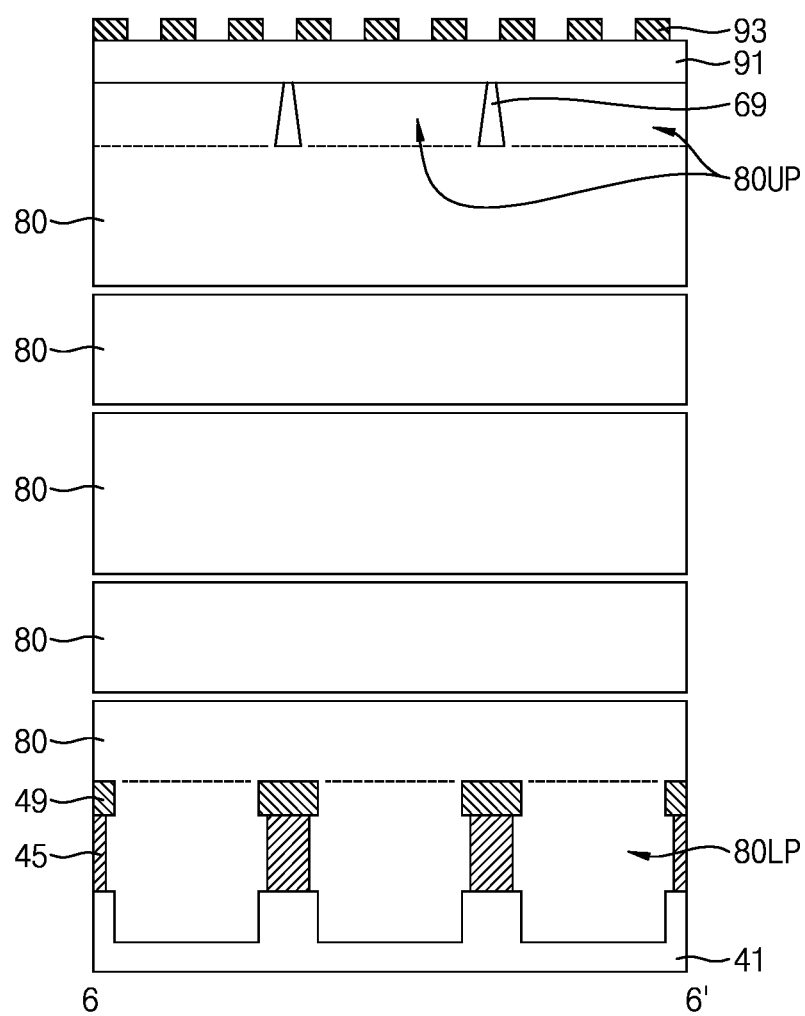

FIGS. 11 and 22 are layouts of semiconductor device formation methods according to embodiments of the disclosure. FIGS. 12 to 21, FIGS. 24 to 31, FIG. 33, FIG. 36, and FIGS. 38 to 44 are cross-sectional views of semiconductor device formation methods according to embodiments of the disclosure. FIG. 23 may be a partial view showing a portion 8 of FIG. 21. FIG. 32 may be a partial view showing a portion 8 of FIG. 31. FIGS. 34 and 35 may be partial views showing a portion 8 of FIG. 33. FIG. 37 may be a partial view showing a portion 8 of FIG. 36. In an embodiment of the disclosure, FIGS. 12 to 21, FIG. 24, FIGS. 26 to 31, FIG. 33, FIG. 36, and FIGS. 38 to 43 may be cross-sectional views taken along line 5-5' in FIG. 3. FIGS. 25 and 44 may be cross-sectional views taken along line 6-6' in FIG. 3.

Figure 12:
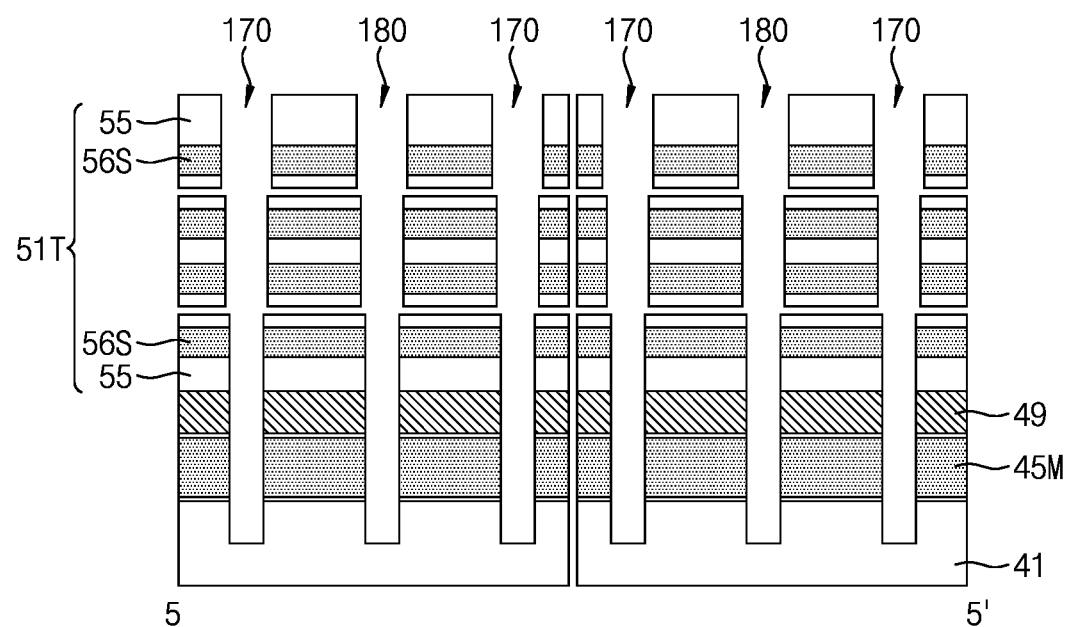

Referring to FIGS. 3, 11 and 12, the semiconductor device formation methods according to the embodiments of the disclosure may include forming a connecting mold layer 45M on a horizontal wiring layer 41. A lower support 49 may be formed on the connecting mold layer 45M. A first preliminary stack structure 51T may be formed on the lower support 49. The first preliminary stack structure 51T may include a plurality of first mold layers 55 and a plurality of first sacrificial layers 56S which are alternately stacked. A plurality of first channel holes 170 and a plurality of first dummy channel holes 180 may be formed to extend into the horizontal wiring layer 41 while extending through the first preliminary stack structure 51T, the lower support 49 and the connecting mold layer 45M.

In an embodiment of the disclosure, similarly to the description given with reference to FIGS. 1 to 10, at least a part of the substrate 21, the element isolation layer 23, the plurality of impurity regions 25, the plurality of transistors 27, the first lower insulating layer 29, the plurality of peripheral circuit wirings 31, the second lower insulating layer 33 and the third lower insulating layer 35 may be formed under the horizontal wiring layer 41, but no description thereof will be given for simplicity of description.

The horizontal wiring layer 41 may include a single layer or multiple layers. The horizontal wiring layer 41 may include a conductive material such as metal, metal nitride, metal oxide, metal silicide, conductive carbon, polysilicon, amorphous silicon, monocrystalline silicon, or a combination thereof. In an embodiment of the disclosure, the horizontal wiring layer 41 may include a conductive layer such as a polysilicon layer including N-type impurities or a monocrystalline semiconductor layer including N-type impurities.

The connecting mold layer 45M may be formed between the horizontal wiring layer 41 and the lower support 49. The connecting mold layer 45M may include a material having etch selectivity with respect to the horizontal wiring layer 41 and the lower support 49. The connecting mold layer 45M may include a single layer or multiple layers. The connecting mold layer 45M may include silicon oxide, silicon nitride, silicon oxynitride, low-k dielectrics, high-k dielectrics, or a combination thereof. In an embodiment of the disclosure, the lower support 49 may include a polysilicon layer.

Each of the plurality of first mold layers 55 may include a single layer or multiple layers. Each of the plurality of first mold layers 55 may be dielectrics including at least two selected from the group consisting of Si, O, N, B and C. The plurality of first sacrificial layers 56S may include a material having etch selectivity with respect to the plurality of first mold layers 55. In an embodiment of the disclosure, the plurality of first mold layers 55 may include silicon oxide, and the plurality of first sacrificial layers 56S may include silicon nitride.

Formation of the plurality of first channel holes 170 and the plurality of first dummy channel holes 180 may include anisotropic etching processes which are simultaneously executed under the same conditions. The plurality of first channel holes 170 may be spaced apart from one another. When viewed in a plan view, the plurality of first channel holes 170 may be aligned in a row direction and a column direction.

The plurality of first dummy channel holes 180 may be formed among the plurality of first channel holes 170. Each of the first dummy channel holes 180 may have various shapes such as an oval, a circle, a bar, or a combination thereof when viewed in a plan view. In an embodiment of the disclosure, each of the first dummy channel holes 180 may include an oval shape or a bar shape having a round edge. In each of the plurality of first dummy channel holes 180, the shorter-axis width thereof may be substantially equal to the diameter of each of the plurality of first channel holes 170, and the longer-axis length thereof may be greater than the diameter of each of the plurality of first channel holes 170. In each of the plurality of first dummy channel holes 180, the longer-axis length thereof may be 2 to 4 times the diameter of each of the plurality of first channel holes 170. The distance among the plurality of first dummy channel holes 180 may be smaller than the minimum distance between the first dummy channel holes 180 and the plurality of first channel holes 170.

In an embodiment of the disclosure, each of the plurality of first dummy channel holes 180 may include substantially the same shape as each of the plurality of first channel holes 170.

Figure 13:
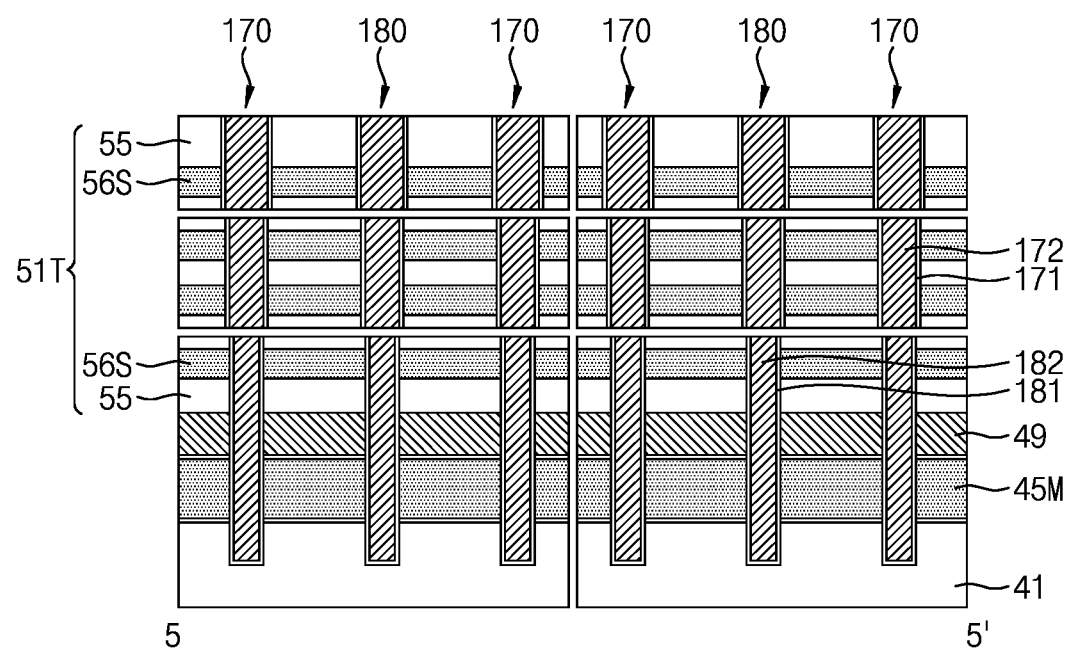

Referring to FIGS. 3, 11 and 13, a first sacrificial liner 171 and first sacrificial plugs 172 may be formed in the plurality of first channel holes 170, and a first dummy sacrificial liner 181 and first dummy sacrificial plugs 182 may be formed in the plurality of first dummy channel holes 180. The first sacrificial liner 171 may surround a side surface and a bottom of each of the first sacrificial plugs 172. The first dummy sacrificial liner 181 may surround a side surface and a bottom of each of the first dummy sacrificial plugs 182. In an embodiment of the disclosure, the first sacrificial liner 171 and the first dummy sacrificial liner 181 may include silicon nitride. The first sacrificial plugs 172 and the first dummy sacrificial plugs 182 may include polysilicon.

Figure 14:
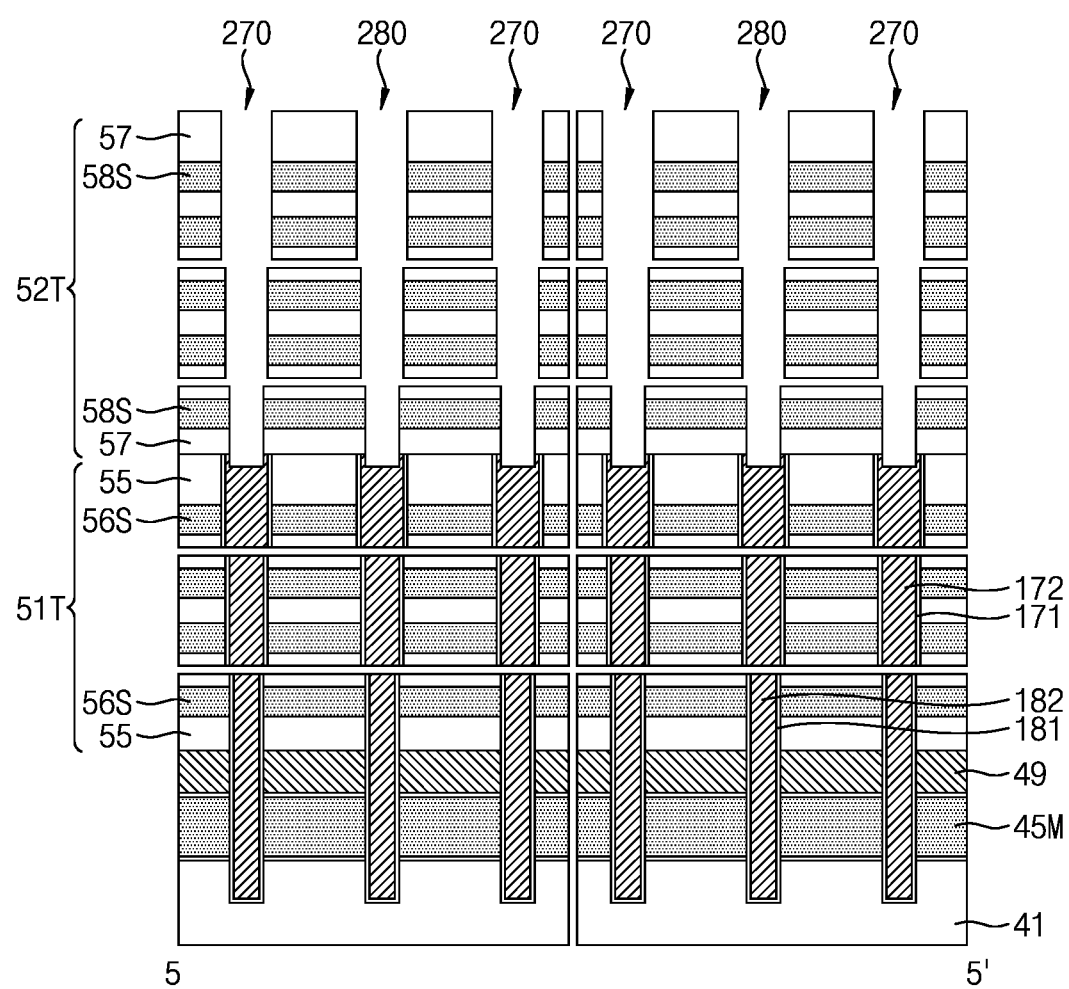

Referring to FIGS. 3, 11 and 14, a second preliminary stack structure 52T may be formed on the first preliminary stack structure 51T. The second preliminary stack structure 52T may include a plurality of second mold layers 57 and a plurality of second sacrificial layers 58S which are alternately stacked. A plurality of second channel holes 270 and a plurality of second dummy channel holes 280 may be formed to communicate with the plurality of first channel holes 170 and the plurality of first dummy channel holes 180 while extending through the second preliminary stack structure 52T. In other words, the plurality of second channel holes 270 may overlap and coincide with the plurality of first channel holes 170 and the second dummy channel holes 280 may overlap and coincide with the plurality of first dummy holes 180.

The plurality of second mold layers 57 and the plurality of second sacrificial layers 58S may be disposed over the plurality of first mold layers 55 and the plurality of first sacrificial layers 56S, to overlap therewith. The plurality of second mold layers 57 and the plurality of second sacrificial layers 58S may include configurations similar to configurations of the plurality of first mold layers 55 and the plurality of first sacrificial layers 56S. The plurality of second channel holes 270 and the plurality of second dummy channel holes 280 may include sizes, alignments and positions similar to those of the plurality of first channel holes 170 and the plurality of first dummy channel holes 180.

Figure 15:
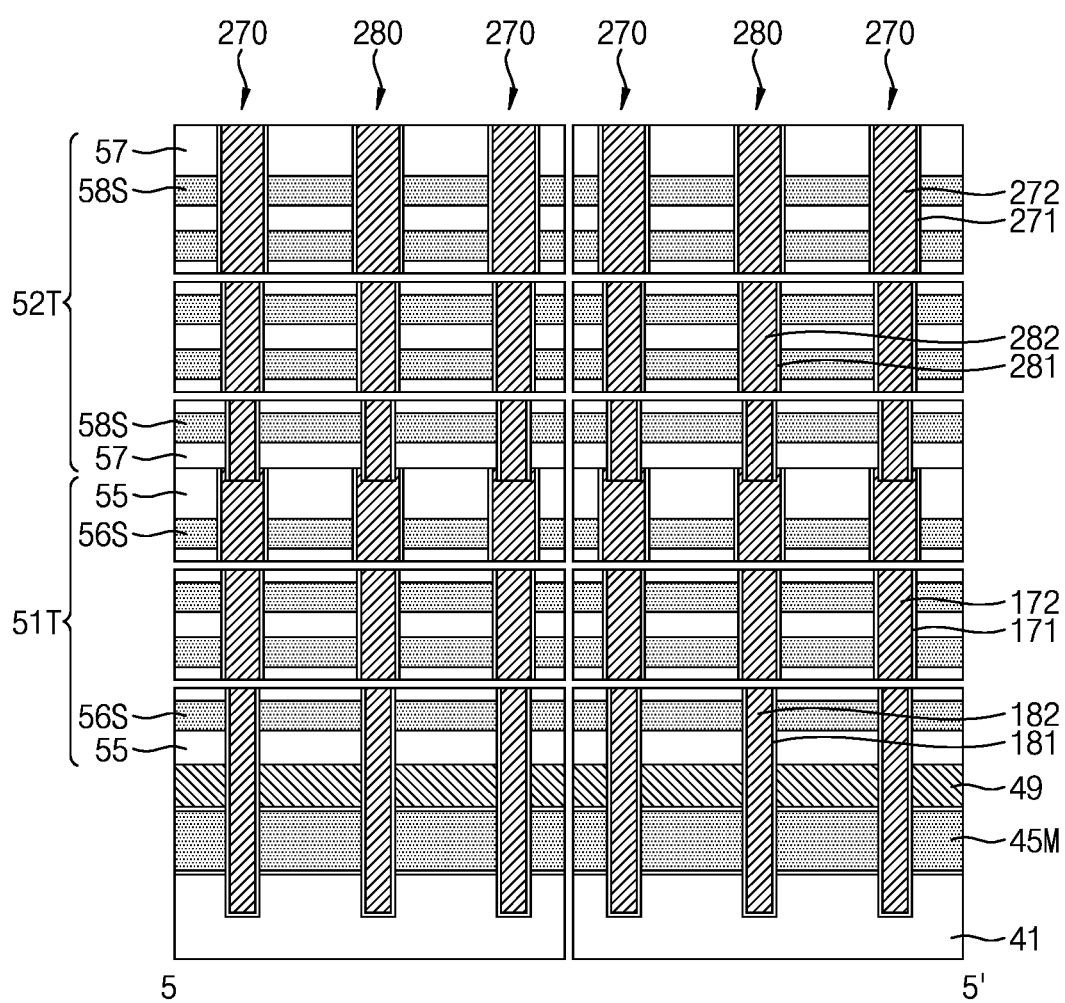

Referring to FIGS. 3, 11 and 15, a second sacrificial liner 271 and second sacrificial plugs 272 may be formed in the plurality of second channel holes 270, and a second dummy sacrificial liner 281 and second dummy sacrificial plugs 282 may be formed in the plurality of second dummy channel holes 280. The second sacrificial liner 271 may surround a side surface of each of the second sacrificial plugs 272. The second dummy sacrificial liner 281 may surround a side surface of each of the second dummy sacrificial plugs 282. In an embodiment of the disclosure, the second sacrificial liner 271 and the second dummy sacrificial liner 281 may include silicon nitride. The second sacrificial plugs 272 and the second dummy sacrificial plugs 282 may include polysilicon.

Figure 16:
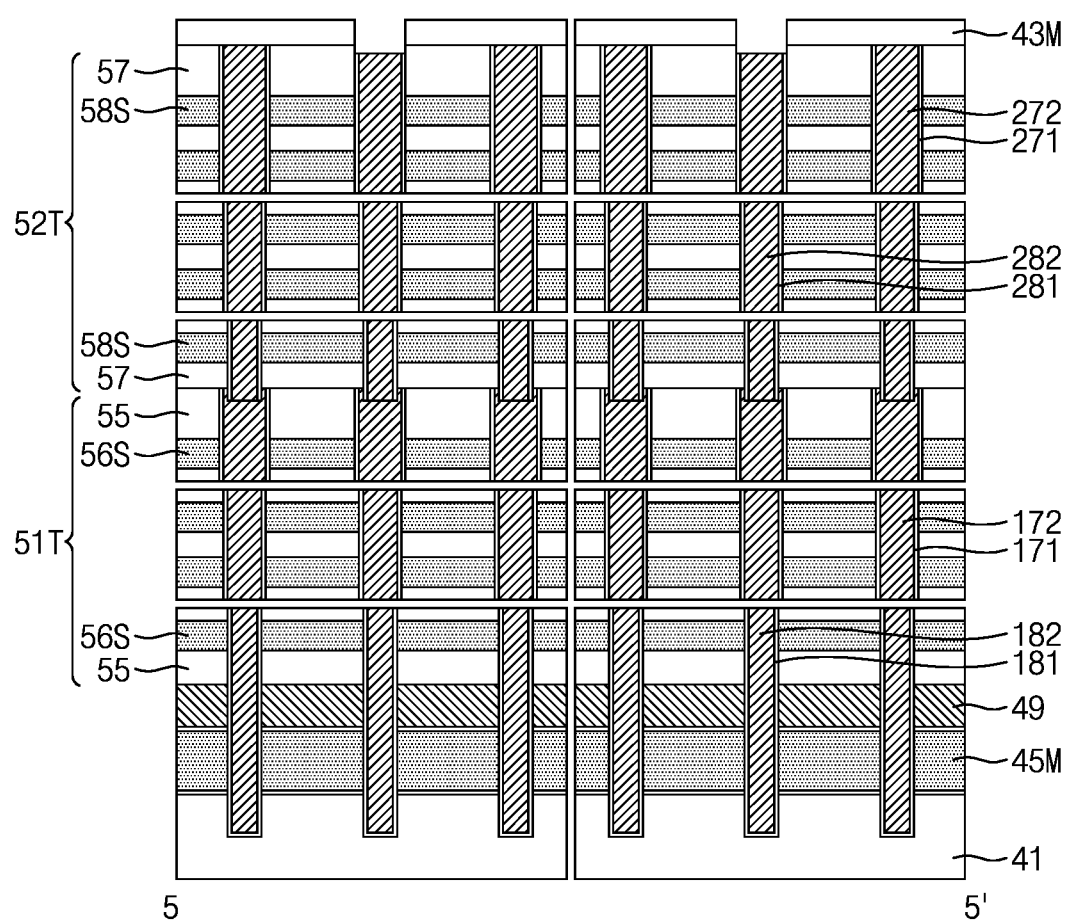

Referring to FIGS. 3, 11 and 16, a first mask pattern 43M may be formed on the second preliminary stack structure 52T. The first mask pattern 43M may cover the second sacrificial liner 271 and the second sacrificial plugs 272 while exposing the second dummy sacrificial liner 281 and the second dummy sacrificial plugs 282. The second dummy sacrificial liner 281 and the second dummy sacrificial plugs 282 may be partially etched using the first mask pattern 43M as an etch mask. Upper surfaces of the second dummy sacrificial liner 281 and the second dummy sacrificial plugs 282 may be recessed to a lower level than an uppermost end of the second preliminary stack structure 52T. For example, upper surfaces of the second dummy sacrificial liner 281 and the second dummy sacrificial plugs 282 may be recessed to a level below the top surface of the uppermost second mold layer 57.

Figure 17:
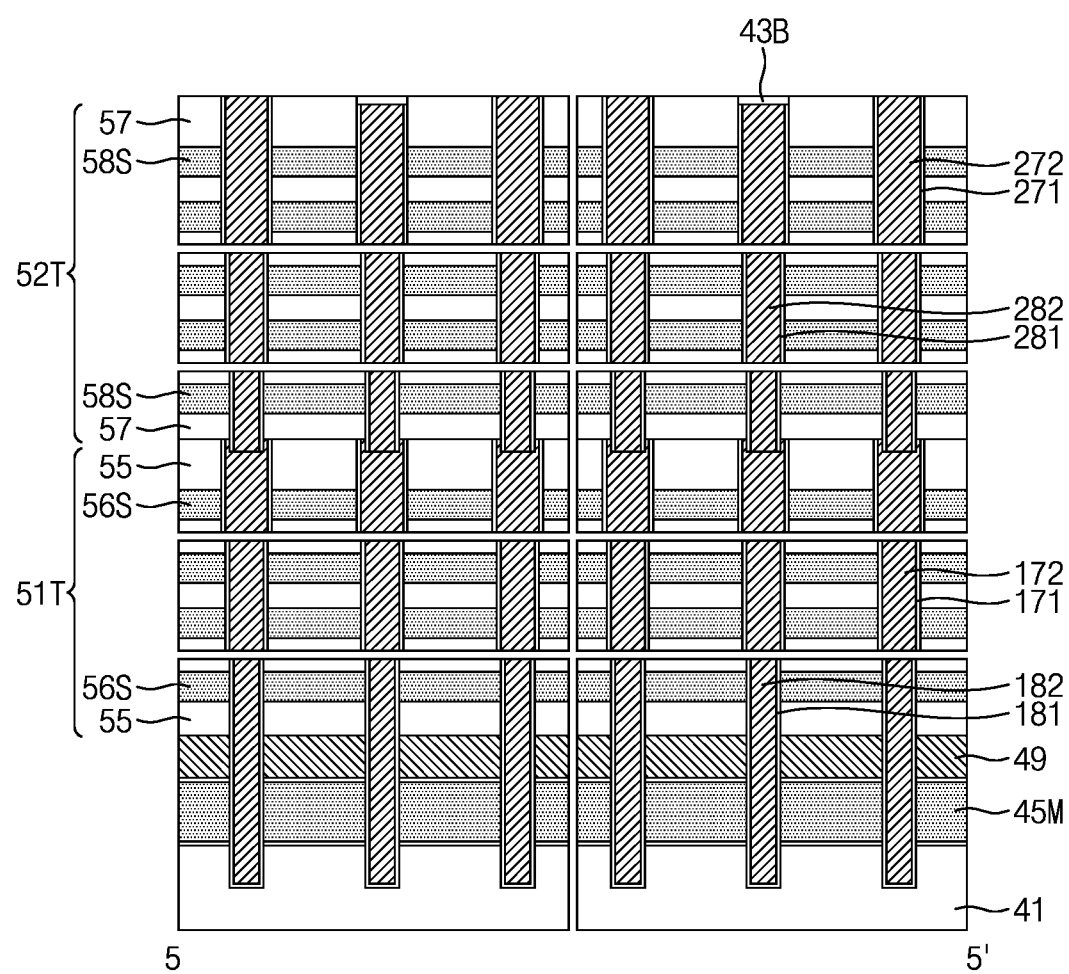

Referring to FIGS. 3, 11 and 17, an upper blocking pattern 43B may be formed on the second dummy sacrificial liner 281 and the second dummy sacrificial plugs 282. In an embodiment of the disclosure, the upper blocking pattern 43B may include silicon oxide. Formation of the upper blocking pattern 43B may include a thin film formation process and a planarization process. The planarization process may include a chemical mechanical polishing (CMP) process, an etch-back process, or a combination thereof. Upper surfaces of the upper blocking pattern 43B, the second preliminary stack structure 52T and the second sacrificial plugs 272 may be exposed in substantially the same plane.

Figure 18:
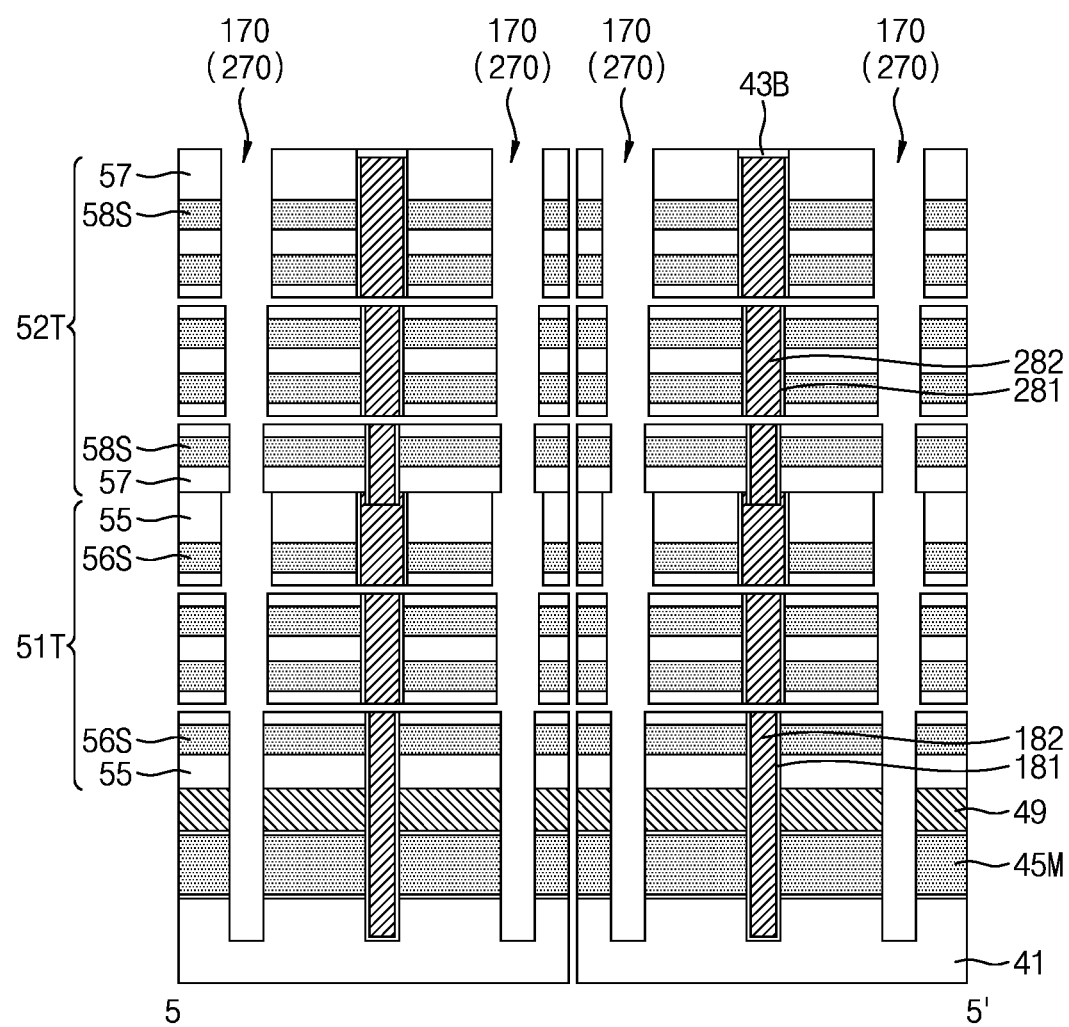

Referring to FIGS. 3, 11 and 18, the second sacrificial plugs 272, the first sacrificial plugs 172, the first sacrificial liner 171 and the second sacrificial liner 271 may be removed and, as such, side walls and bottoms of the plurality of second channel holes 270 and the plurality of first channel holes 170 may be exposed. The plurality of second channel holes 270 may communicate with upper portions of the plurality of first channel holes 170.

Figure 19:
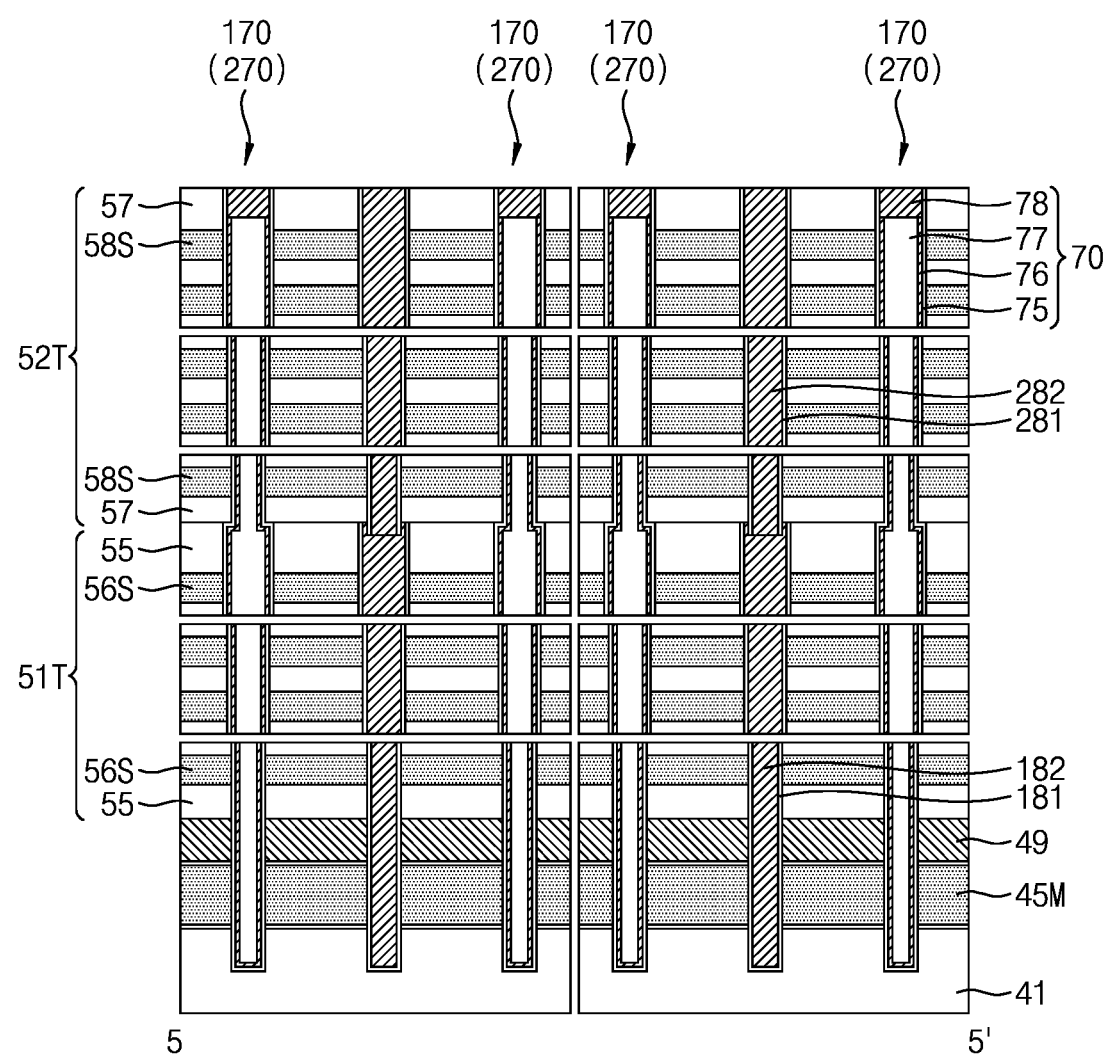

Referring to FIGS. 3, 11 and 19, a plurality of channel structures 70 may be formed in the plurality of second channel holes 270 and the plurality of first channel holes 170. Each of the plurality of channel structures 70 may include a core pattern 77, a channel layer 76 surrounding an outside of the core pattern 77, an information storage pattern 75 surrounding an outside of the channel layer 76, and a bit pad 78 on the channel layer 76.

The core pattern 77 may include silicon oxide, silicon nitride, silicon oxynitride, low-k dielectrics, high-k dielectrics, polysilicon, or a combination thereof. The channel layer 76 may include a semiconductor layer such as polysilicon, amorphous silicon, monocrystalline silicon, or a combination thereof. The bit pad 78 may include a conductive material such as metal, metal nitride, metal oxide, metal silicide, conductive carbon, polysilicon, amorphous silicon, monocrystalline silicon, or a combination thereof. In an embodiment of the disclosure, the bit pad 78 may include a polysilicon layer including N-type impurities.

Formation of the plurality of channel structures 70 may include a plurality of thin film formation processes and a planarization process. During formation of the plurality of channel structures 70, the upper blocking pattern 43B may be removed. Upper surfaces of the plurality of channel structures 70, the second dummy sacrificial plugs 282 and the second preliminary stack structure 52T may be exposed in substantially the same plane.

Figure 20:
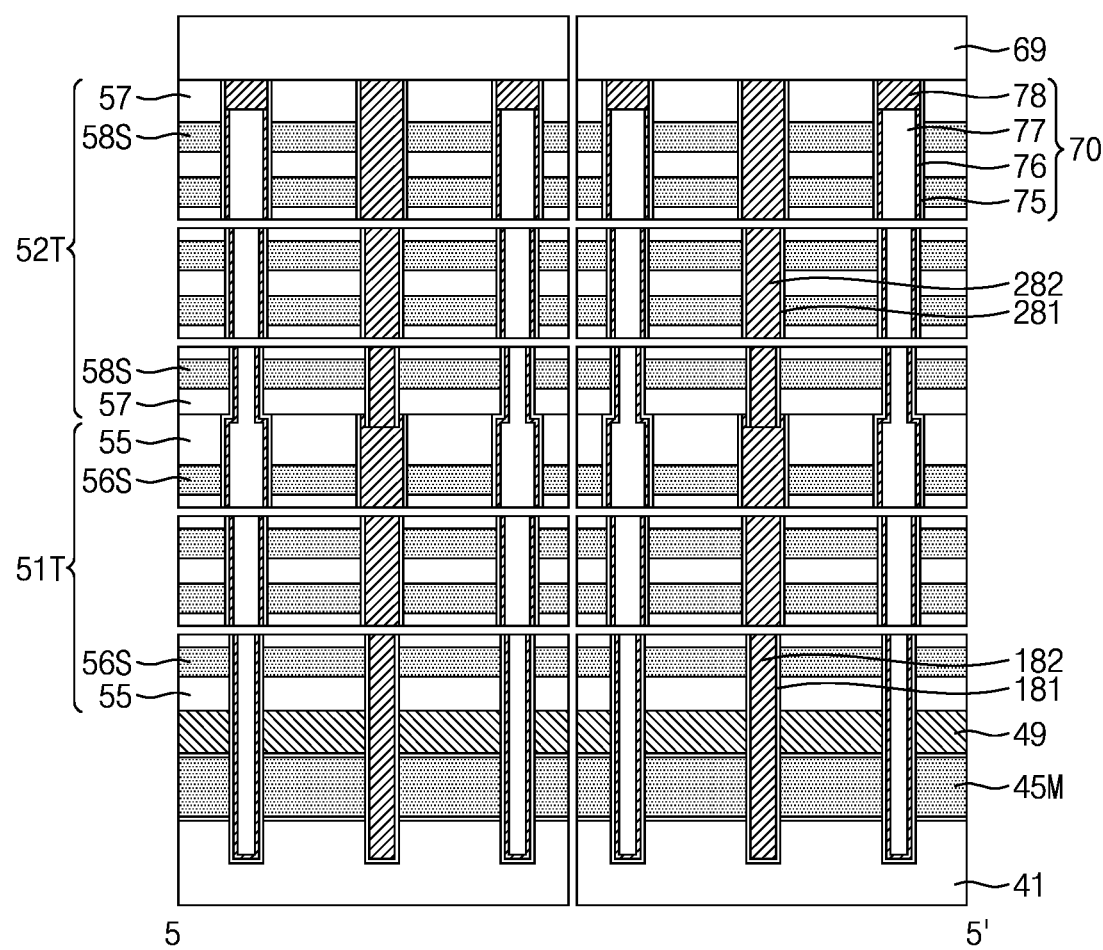

Referring to FIGS. 3, 11 and 20, an upper support 69 may be formed on the plurality of channel structures 70, the second dummy sacrificial plugs 282 and the second preliminary stack structure 52T. The upper support 69 may include silicon oxide, silicon nitride, silicon oxynitride, low-k dielectrics, high-k dielectrics, polysilicon, or a combination thereof. The upper support 69 may include a single layer or multiple layers. In an embodiment, the upper support 69 may include a silicon oxide layer.

Referring to FIGS. 3, 21, 22 and 23, a plurality of upper holes 380 may be formed to extend through the upper support 69, thereby exposing the second dummy sacrificial plugs 282. In an embodiment of the disclosure, the distance between the plurality of upper holes 380 may be greater than the distance between the plurality of first dummy channel holes 180. The distance between the plurality of upper holes 380 may be greater than the distance between the plurality of second dummy channel holes 280.

The thickness of the connecting mold layer 45M may be greater than the thickness of each of the plurality of first sacrificial layers 56S. In an embodiment of the disclosure, the thickness of the connecting mold layer 45M may be 1.2 to 5 times the thickness of each of the plurality of first sacrificial layers 56S. The thickness of the connecting mold layer 45M may be about 2 times the thickness of each of the plurality of first sacrificial layers 56S. The connecting mold layer 45M may include a lower layer 45L, an upper layer 45U, and an intermediate layer 45C between the lower layer 45L and the upper layer 45U. In an embodiment of the disclosure, the lower layer 45L and the upper layer 45U may include a silicon oxide layer, and the intermediate layer 45C may include a silicon nitride layer.

The information storage pattern 75 may include a tunnel insulating layer 71 surrounding an outside of the channel layer 76, a charge storage layer 72 surrounding an outside of the tunnel insulating layer 71, and a first blocking layer 73 surrounding an outside of the charge storage layer 72. The tunnel insulating layer 71 may include an insulating layer such as silicon oxide. The charge storage layer 72 may include an insulating layer such as silicon nitride. The first blocking layer 73 may include an insulating layer such as silicon oxide, silicon nitride, silicon oxynitride, high-k dielectrics (for example, metal oxide such as HfO, AlO, or a combination thereof, or metal silicate such as HfSiO), or a combination thereof.

Referring to FIGS. 3, 22, 24 and 25, the second dummy sacrificial plugs 282, the first dummy sacrificial plugs 182, the first dummy sacrificial liner 181, and the second dummy sacrificial liner 281 may be removed, thereby exposing side walls and bottoms of the plurality of upper holes 380, the plurality of second dummy channel holes 280 and the plurality of first dummy channel holes 180. The plurality of upper holes 380, the plurality of second dummy channel holes 280 and the plurality of first dummy channel holes 180 may communicate with one another. In other words, the plurality of upper holes 380, the plurality of second dummy channel holes 280 and the plurality of first dummy channel holes 180 may form a single hole or opening.

Figure 26:
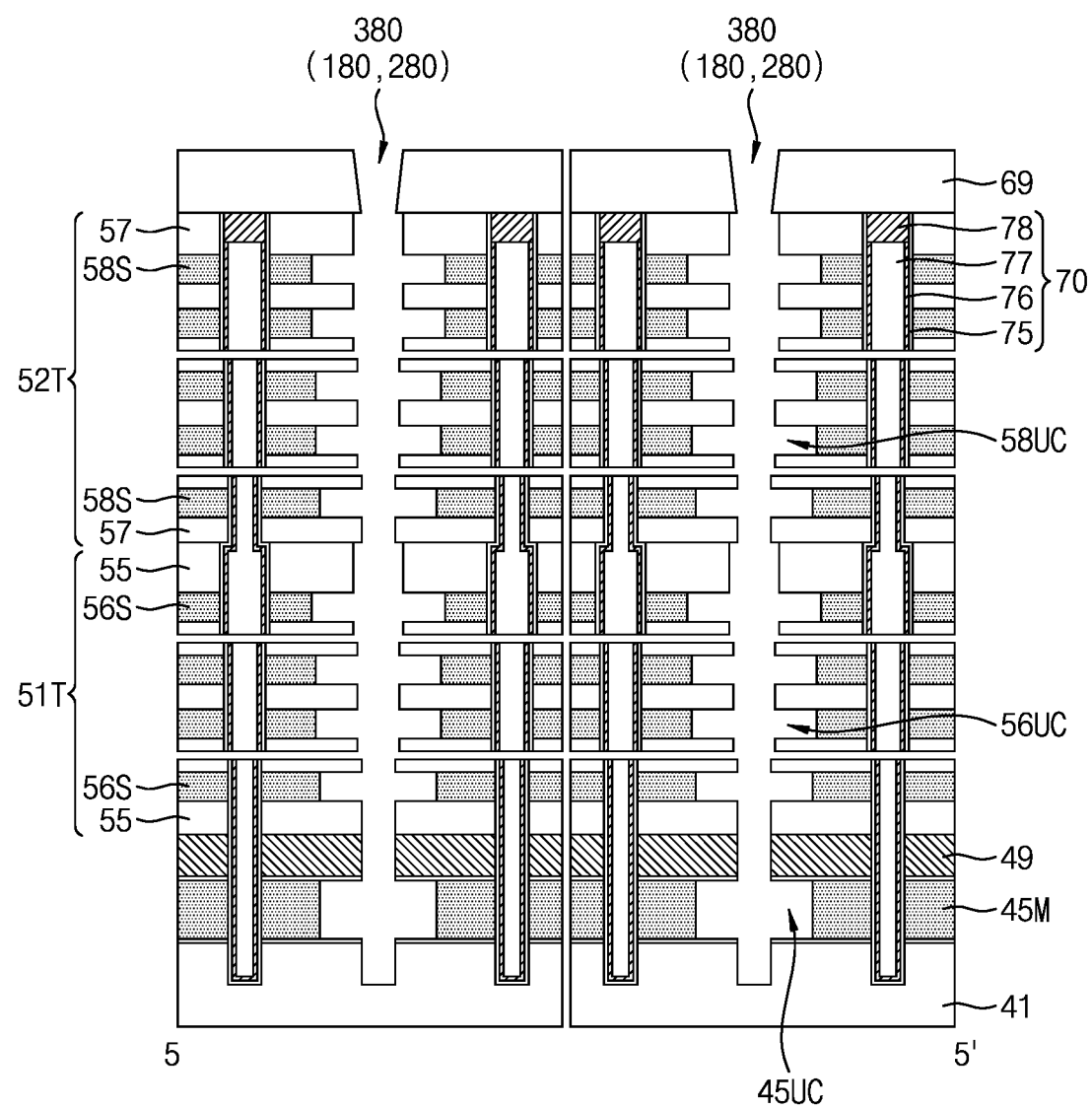

Referring to FIGS. 3, 22 and 26, the plurality of second sacrificial layers 58S, the plurality of first sacrificial layers 56S and the intermediate layer 45C, which are exposed at the side walls of the plurality of second dummy channel holes 280 and the plurality of first dummy channel holes 180, may be partially removed, thereby forming a plurality of first sealing undercut regions 45UC and a plurality of first undercut regions 56UC and 58UC. An undercut region may be overlapped by a protruded part of a layer directly thereabove.

Figure 27:
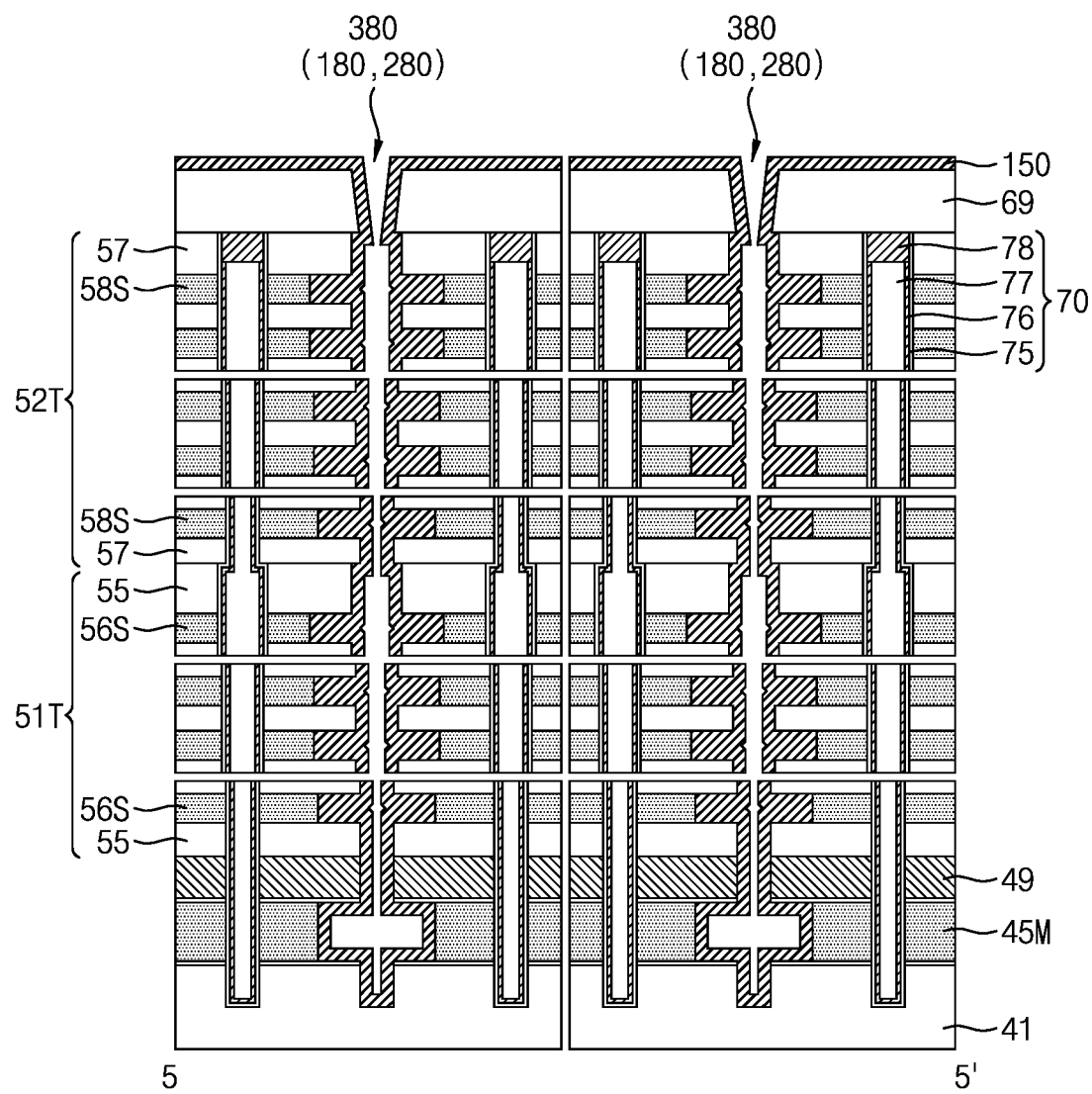

Referring to FIGS. 3, 22 and 27, a sacrificial blocking layer 150 may be formed in the plurality of upper holes 380, the plurality of second dummy channel holes 280, the plurality of first dummy channel holes 180, the plurality of first sealing undercut regions 45UC and the plurality of first undercut regions 56UC and 58UC. In an embodiment of the disclosure, the sacrificial blocking layer 150 may include a polysilicon layer.

Figure 28:
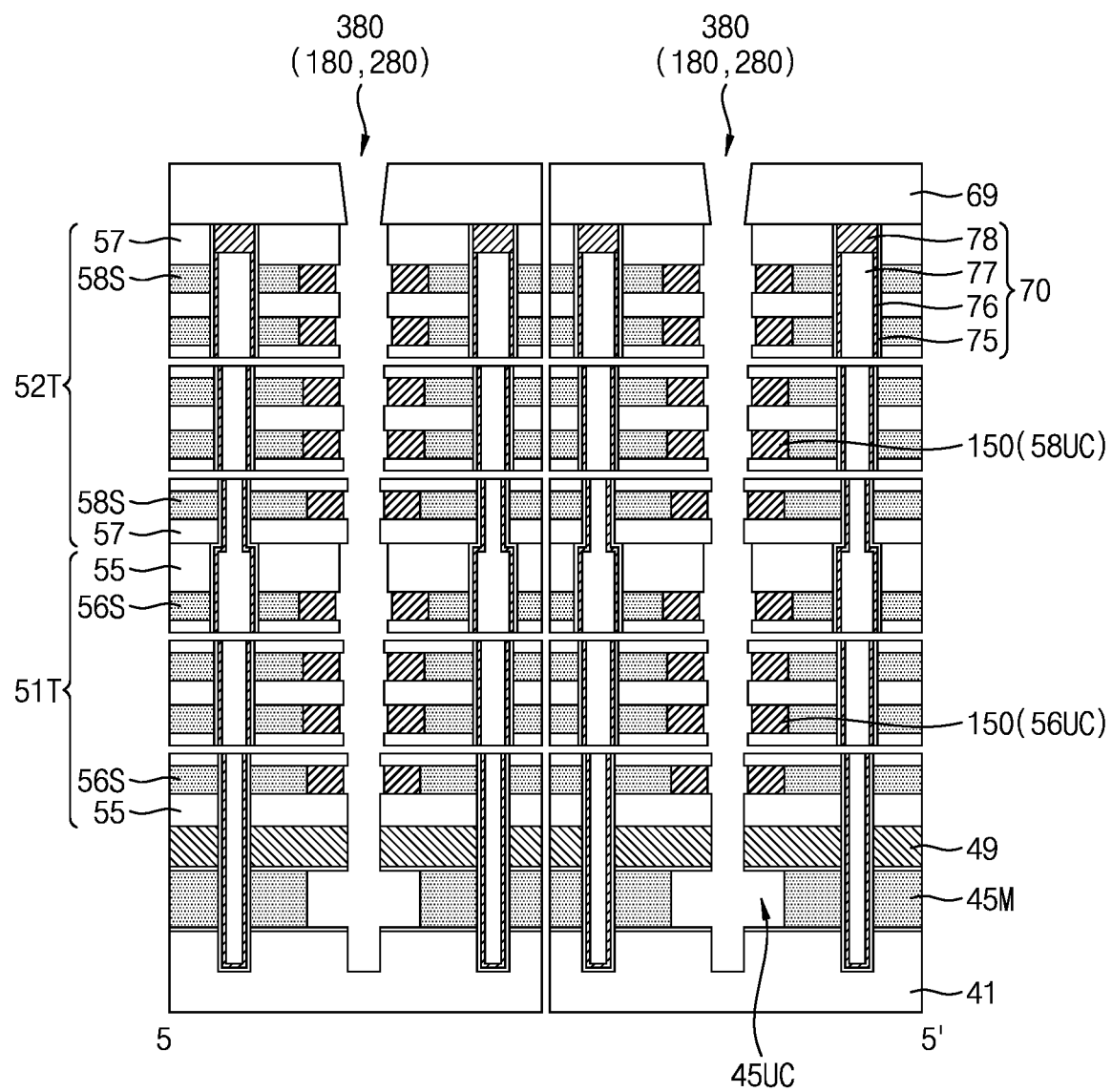

Referring to FIGS. 3, 22 and 28, the sacrificial blocking layer 150 may be etched back, thereby exposing the lower layer 45L, the upper layer 45U and the intermediate layer 45C in the plurality of first sealing undercut regions 45UC. The sacrificial blocking layer 150 may be preserved in the plurality of first undercut regions 56UC and 58UC.

Figure 29:
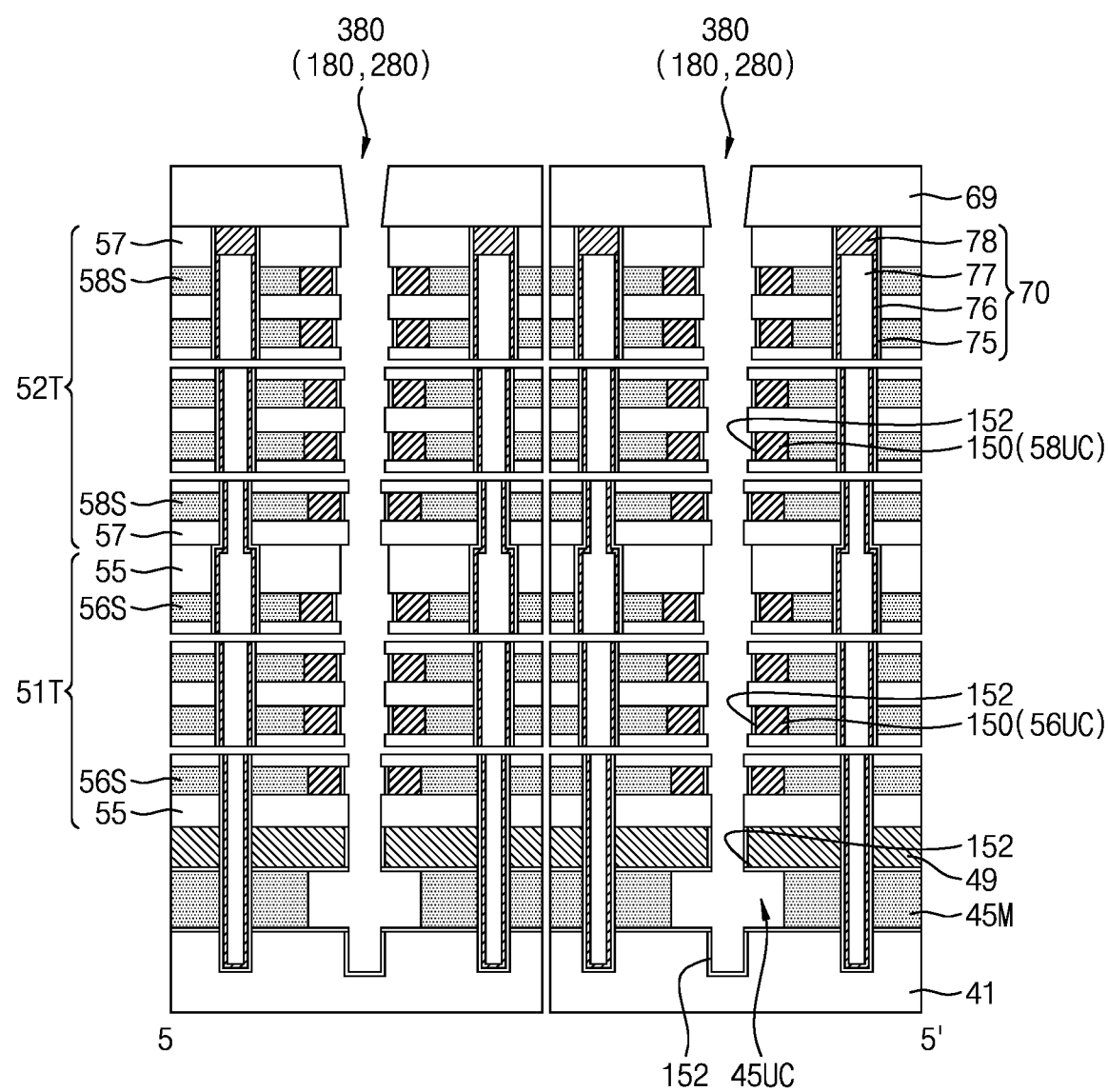

Referring to FIGS. 3, 22 and 29, a first oxide layer 152 may be formed using a first oxidation process. The first oxide layer 152 may be formed on side surfaces of the sacrificial blocking layer 150, a side surface of the lower support 49 and an upper surface of the horizontal wiring layer 41. In an embodiment of the disclosure, the first oxide layer 152 may include silicon oxide.

Figure 30:
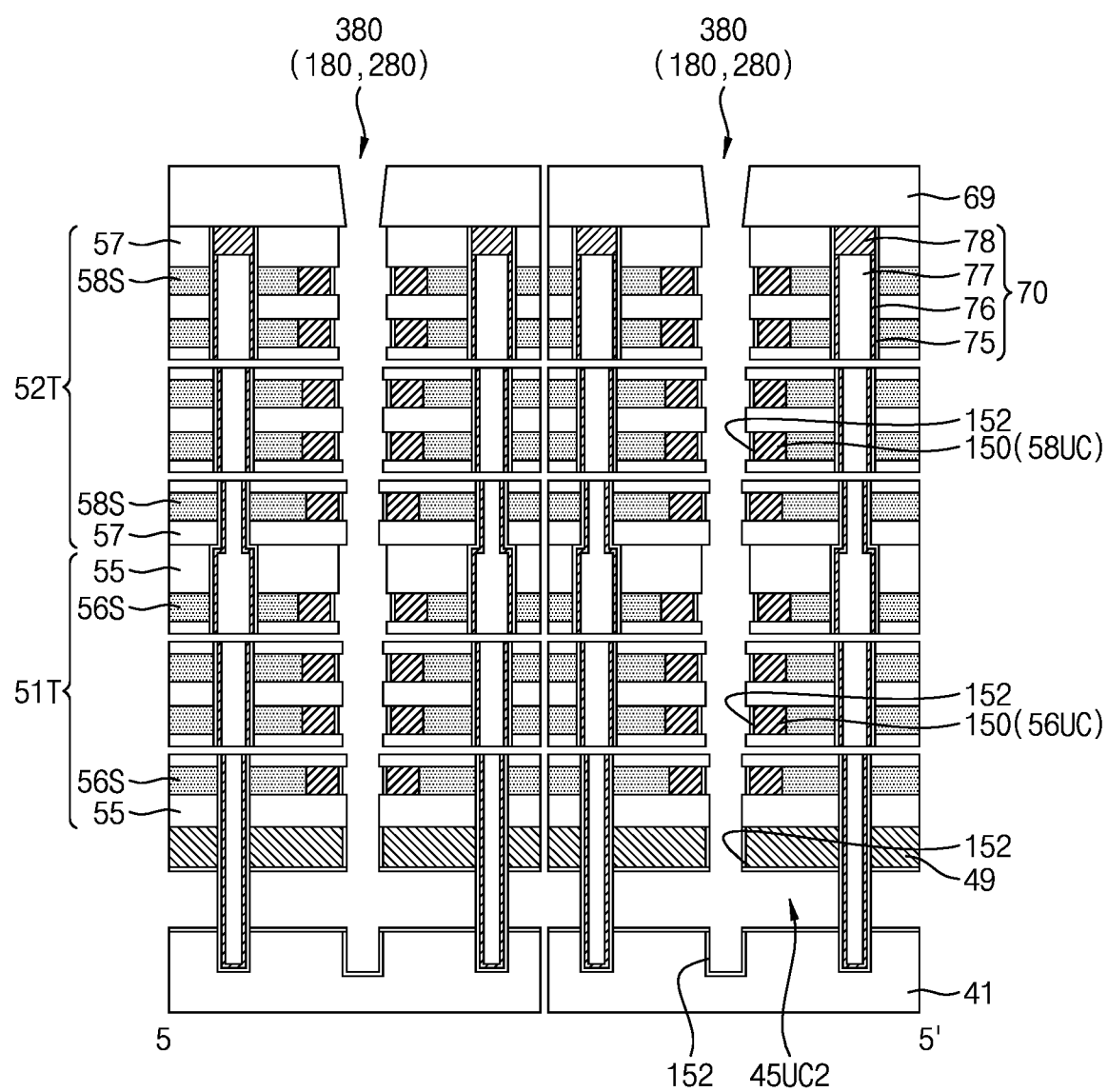

Referring to FIGS. 3, 22 and 30, the intermediate layer 45C of the connecting mold layer 45M may be removed, thereby forming a plurality of second sealing undercut regions 45UC2. The lower layer 45L, the upper layer 45U and the first blocking layer 73 may be exposed in the plurality of second sealing undercut regions 45UC2.

Referring to FIGS. 3, 22, 31 and 32, the first blocking layer 73 may be partially removed, thereby forming a plurality of third sealing undercut regions 45UC3. For example, the first blocking layer between the horizontal wiring layer 41 and the lower support 49 may be removed. The charge storage layer 72 may be exposed in the plurality of third sealing undercut regions 45UC3.

During partial removal of the first blocking layer 73, the lower layer 45L, the upper layer 45U and the first oxide layer 152 may also be removed. During partial removal of the first blocking layer 73, side surfaces of the plurality of first mold layers 55, the plurality of second mold layers 57 and the upper support 69 may be etched, thereby enlarging the plurality of upper holes 380, the plurality of second dummy channel holes 280 and the plurality of first dummy channel holes 180.

Referring to FIGS. 3, 22, 33, 34 and 35, a second oxide layer 154 may be formed using a second oxidation process. The second oxide layer 154 may be formed on side surfaces of the sacrificial blocking layer 150, side and lower surfaces of the lower support 49 and an upper surface of the horizontal wiring layer 41. In an embodiment of the disclosure, the second oxide layer 154 may include silicon oxide.

The charge storage layer 72 may be partially removed, thereby forming a plurality of fourth sealing undercut regions 45UC4. The tunnel insulating layer 71 may be exposed in the plurality of fourth sealing undercut regions 45UC4.

Referring to FIGS. 3, 22, 36 and 37, the tunnel insulating layer 71 may be partially removed, thereby forming a plurality of fifth sealing undercut regions 45UC5. The channel layer 76 may be exposed in the plurality of fifth sealing undercut regions 45UC5. During partial removal of the tunnel insulating layer 71, the second oxide layer 154 may also be removed. During partial removal of the tunnel insulating layer 71, side surfaces of the plurality of first mold layers 55, the plurality of second mold layers 57 and the upper support 69 may be etched, thereby enlarging the plurality of upper holes 380, the plurality of second dummy channel holes 280 and the plurality of first dummy channel holes 180.

In an embodiment of the disclosure, the plurality of second dummy channel holes 280 may be enlarged in a longer-axis direction and, as such, may communicate with one another. The plurality of first dummy channel holes 180 may be enlarged in a longer-axis direction and, as such, may communicate with one another. The upper support 69 may be preserved among the plurality of upper holes 380.

Figure 38:
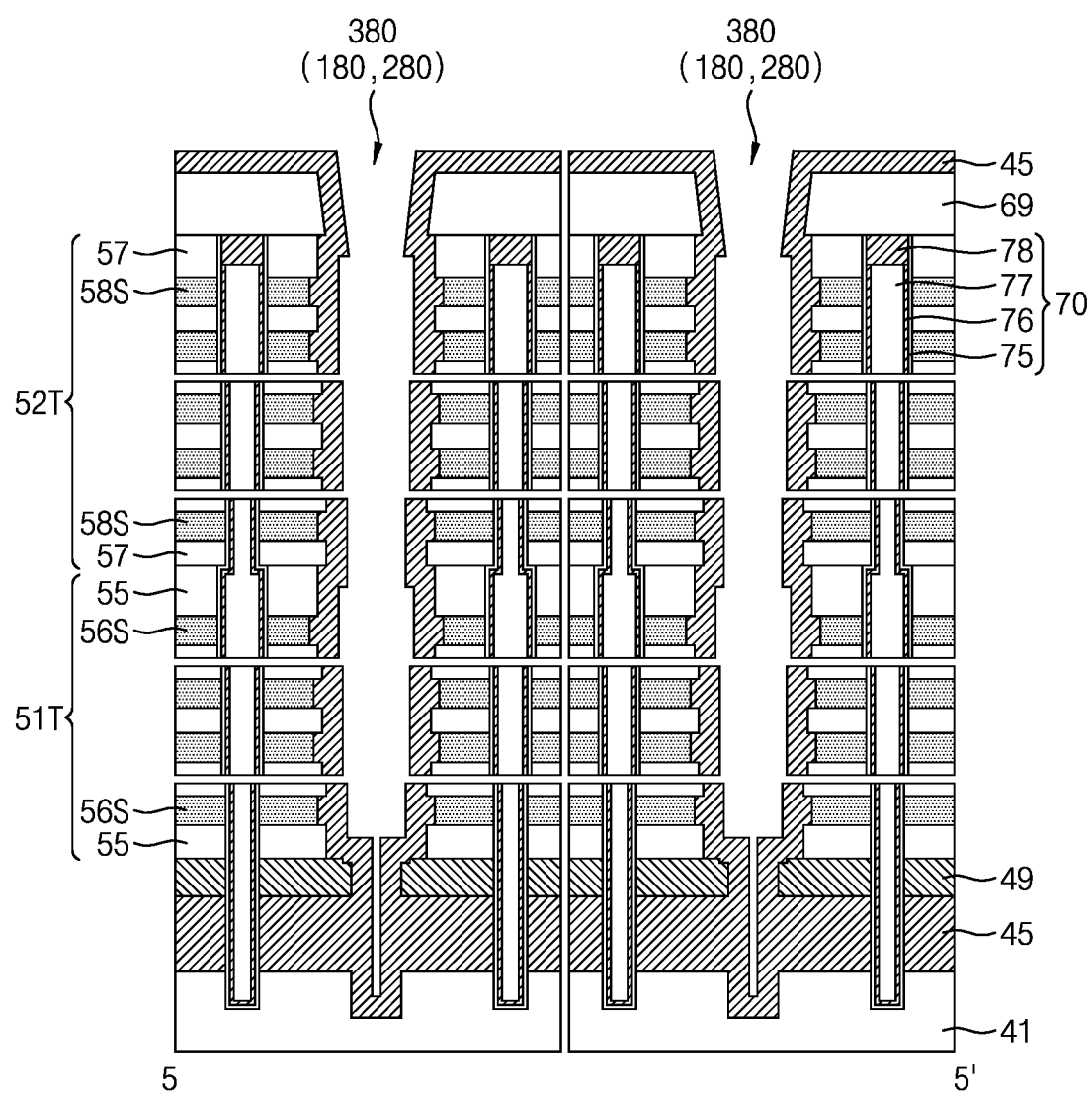

Referring to FIGS. 3, 22 and 38, a sealing conductive layer 45 may be formed in the plurality of fifth sealing undercut regions 45UC5, the plurality of first dummy channel holes 180, the plurality of second dummy channel holes 280 and the plurality of upper holes 380. The sealing conductive layer 45 may include a conductive material such as metal, metal nitride, metal oxide, metal silicide, conductive carbon, polysilicon, amorphous silicon, monocrystalline silicon, or a combination thereof. In an embodiment of the disclosure, the sealing conductive layer 45 may include a polysilicon layer.

Figure 39:
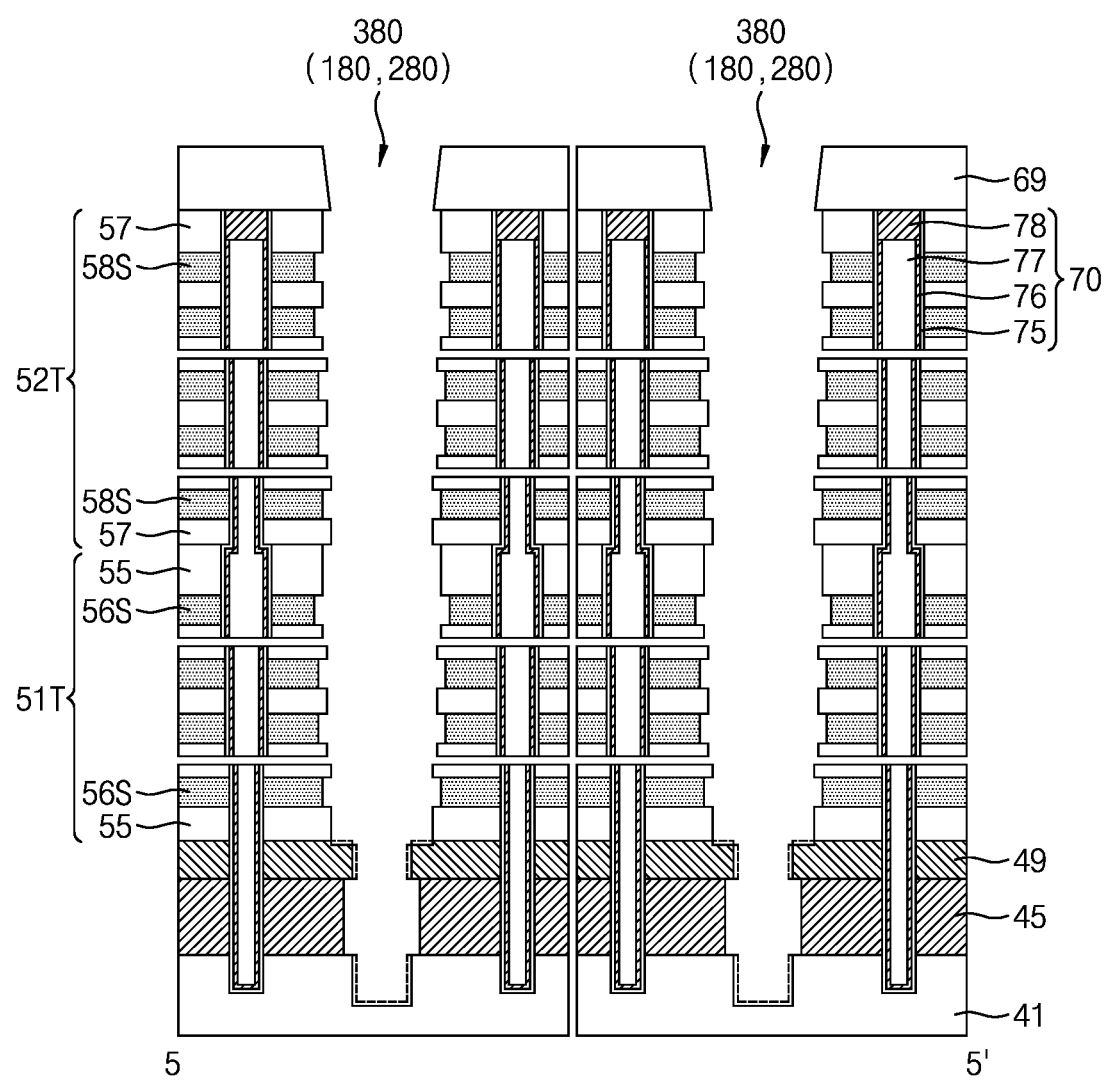

Referring to FIGS. 3, 22, and 39, the sealing conductive layer 45 may be partially removed using an etch-back process, thereby exposing side walls and bottoms of the plurality of upper holes 380, the plurality of second dummy channel holes 280 and the plurality of first dummy channel holes 180. During partial removal of the sealing conductive layer 45, the sacrificial blocking layer 150 may be removed, thereby exposing side surfaces of the plurality of second sacrificial layers 58S and the plurality of first sacrificial layers 56S. During partial removal of the sealing conductive layer 45, lower portions of the plurality of first dummy channel holes 180 may be further enlarged. The sealing conductive layer 45 may be preserved between the horizontal wiring layer 41 and the lower support 49. The sealing conductive layer 45 may directly contact the horizontal wiring layer 41 and the channel layer 76.

Figure 40:
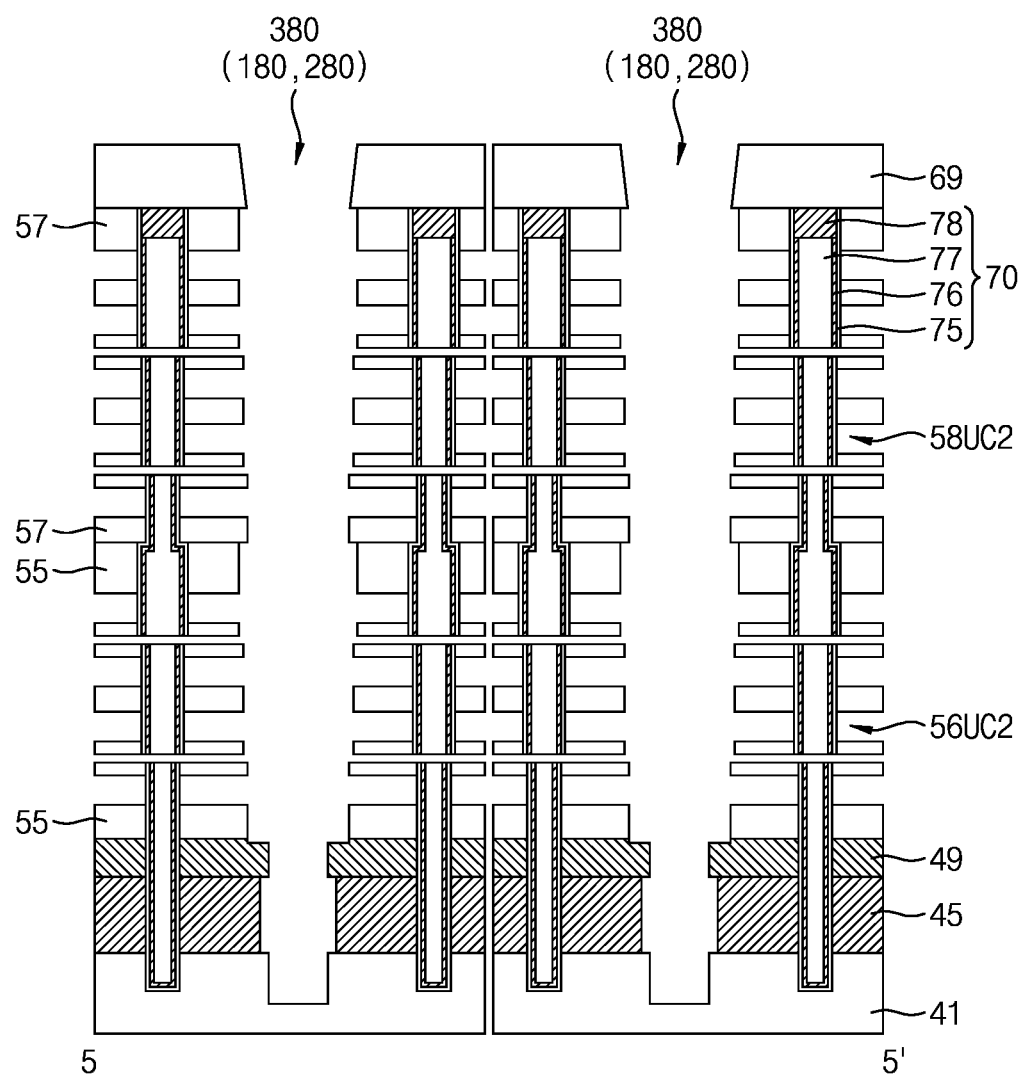

Referring to FIGS. 3, 22 and 40, the plurality of second sacrificial layers 58S and the plurality of first sacrificial layers 56S may be removed, thereby forming a plurality of second undercut regions 56UC2 and 58UC2.

Figure 41:
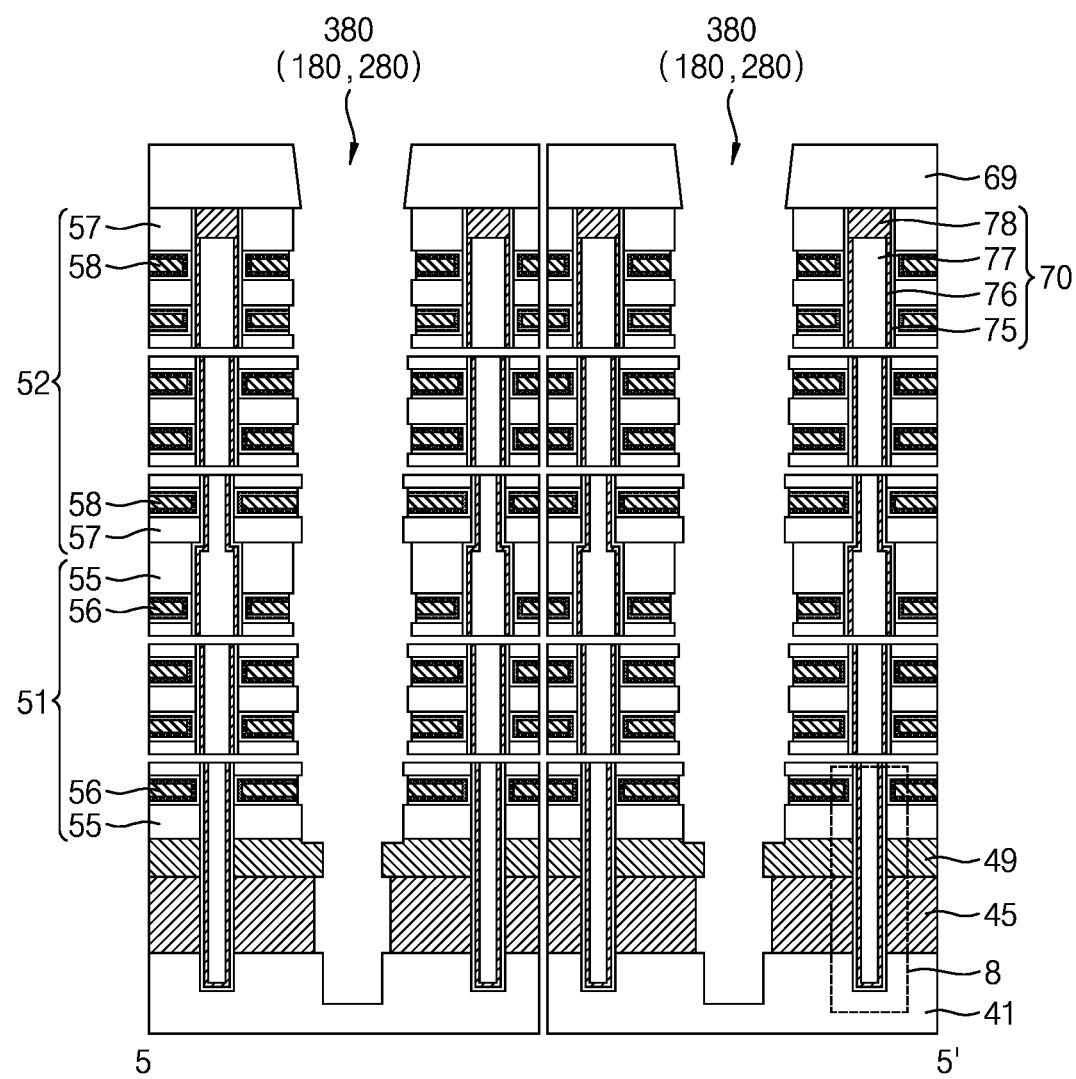

Referring to FIGS. 3, 22 and 41, a plurality of first wiring layers 56 and a plurality of second wiring layers 58 may be formed in the plurality of second undercut regions 56UC2 and 58UC2. The plurality of first mold layers 55 and the plurality of first wiring layers 56 may constitute a first stack structure 51. The plurality of second mold layers 57 and the plurality of second wiring layers 58 may constitute a second stack structure 52.

Figure 42:
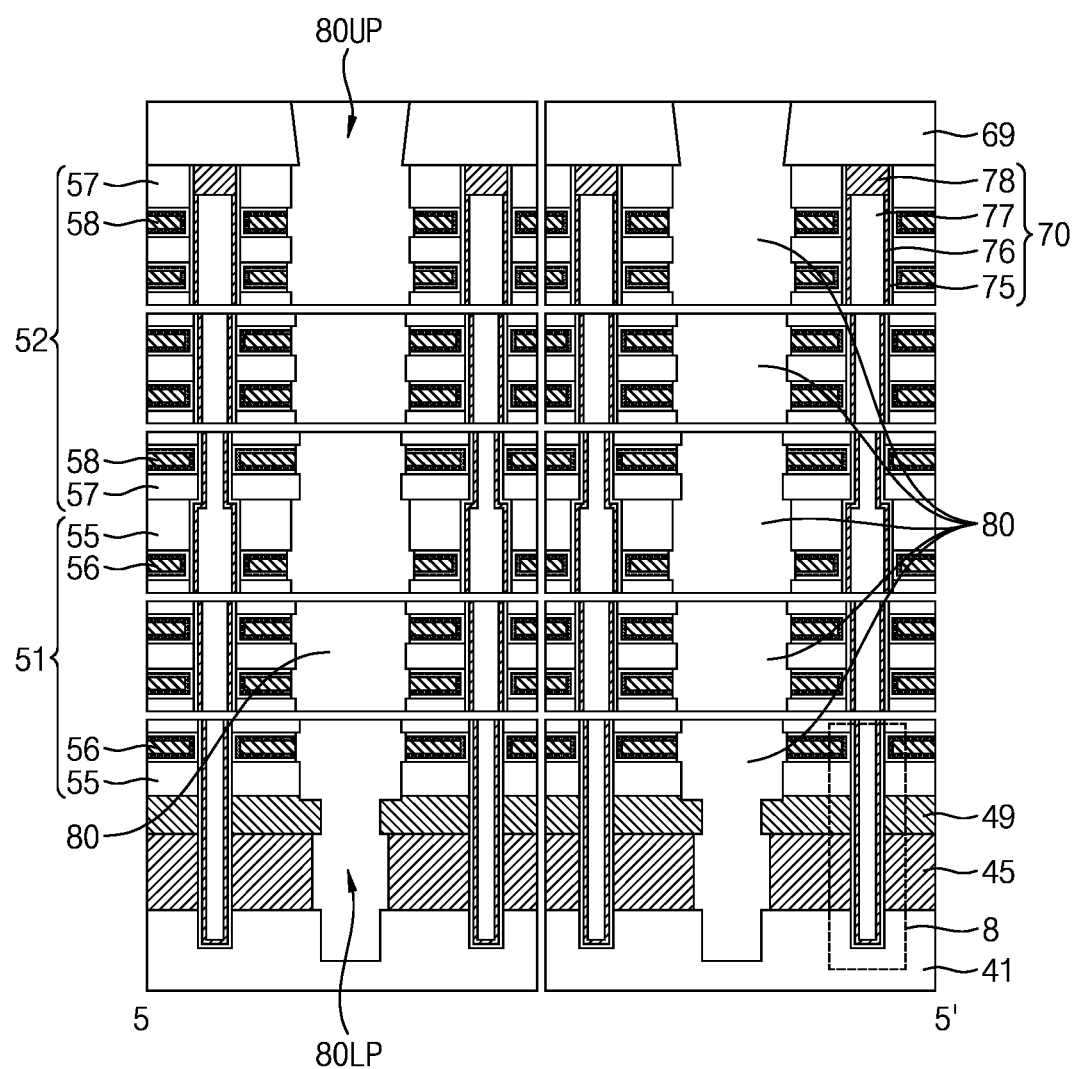
Figure 43:
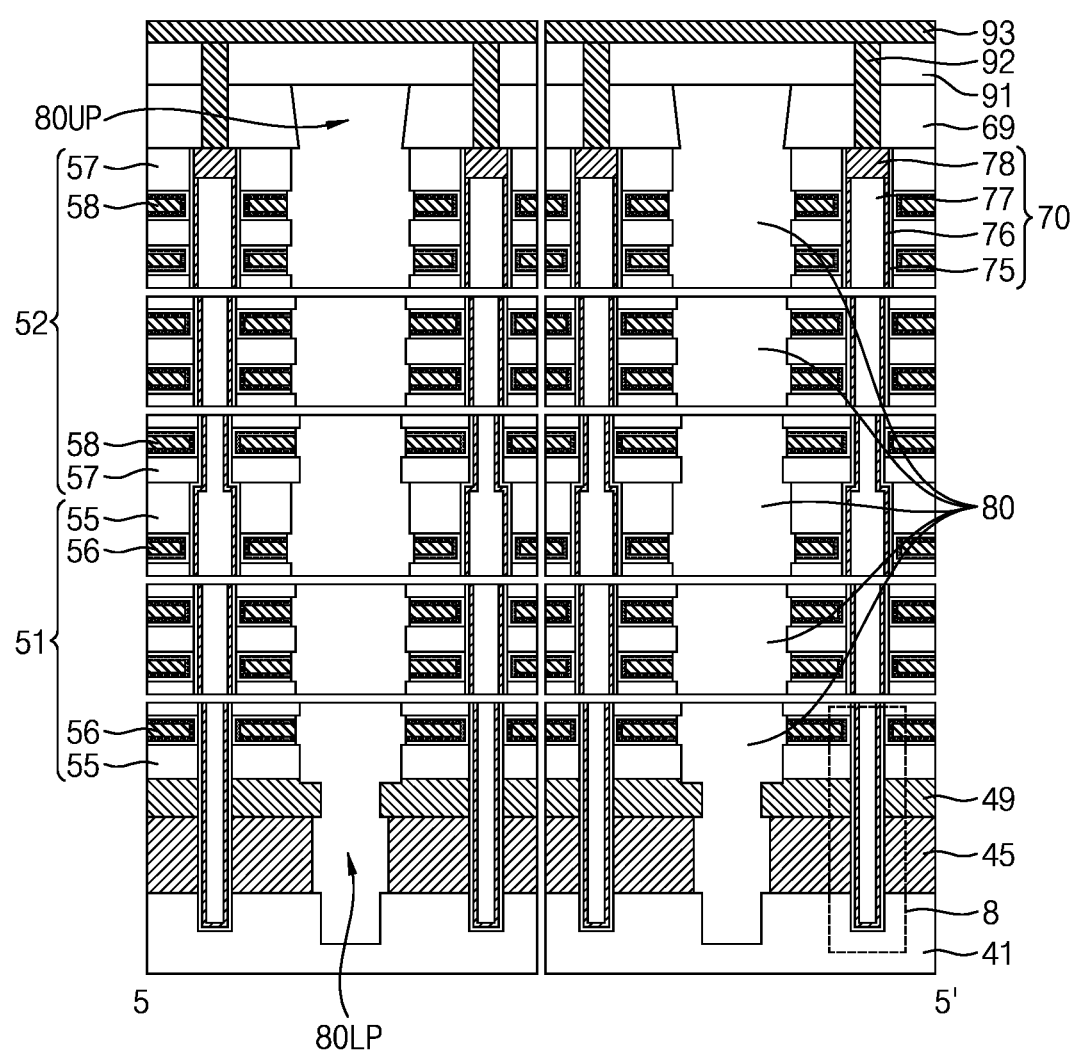

Referring to FIGS. 3, 22 and 42, a plurality of separation patterns 80 may be formed in the plurality of upper holes 380, the plurality of second dummy channel holes 280 and the plurality of first dummy channel holes 180. The plurality of separation patterns 80 may include a single layer or multiple layers. The plurality of separation patterns 80 may include silicon oxide, silicon nitride, silicon oxynitride, silicon boron nitride (SiBN), silicon carbon nitride (SiCN), low-k dielectrics, high-k dielectrics, or a combination thereof.

Referring to FIGS. 3, 22, 43 and 44, a first upper insulating layer 91 may be formed on the upper support 69. A plurality of bit plugs 92 may be formed to be connected to the bit pad 78 while extending through the upper insulating layer 91 and the upper support 69. A plurality of bit lines 93 may be formed on the first upper insulating layer 91, to contact the plurality of bit plugs 92.

The first upper insulating layer 91 may include a single layer or multiple layers. The first upper insulating layer 91 may include silicon oxide, silicon nitride, silicon oxynitride, silicon boron nitride (SiBN), silicon carbon nitride (SiCN), low-k dielectrics, high-k dielectrics, or a combination thereof. Each of the plurality of bit plugs 92 and the plurality of bit lines 93 may include a single layer or multiple layers. Each of the plurality of bit plugs 92 and the plurality of bit lines 93 may include a conductive material such as metal, metal nitride, metal oxide, metal silicide, conductive carbon, polysilicon, amorphous silicon, monocrystalline silicon, or a combination thereof. Each of the plurality of bit plugs 92 and the plurality of bit lines 93 may include W, WN, Ti, TiN, Ta, TaN, Co, Ni, Ru, Pt, polysilicon, conductive carbon, or a combination thereof.

Figure 45:
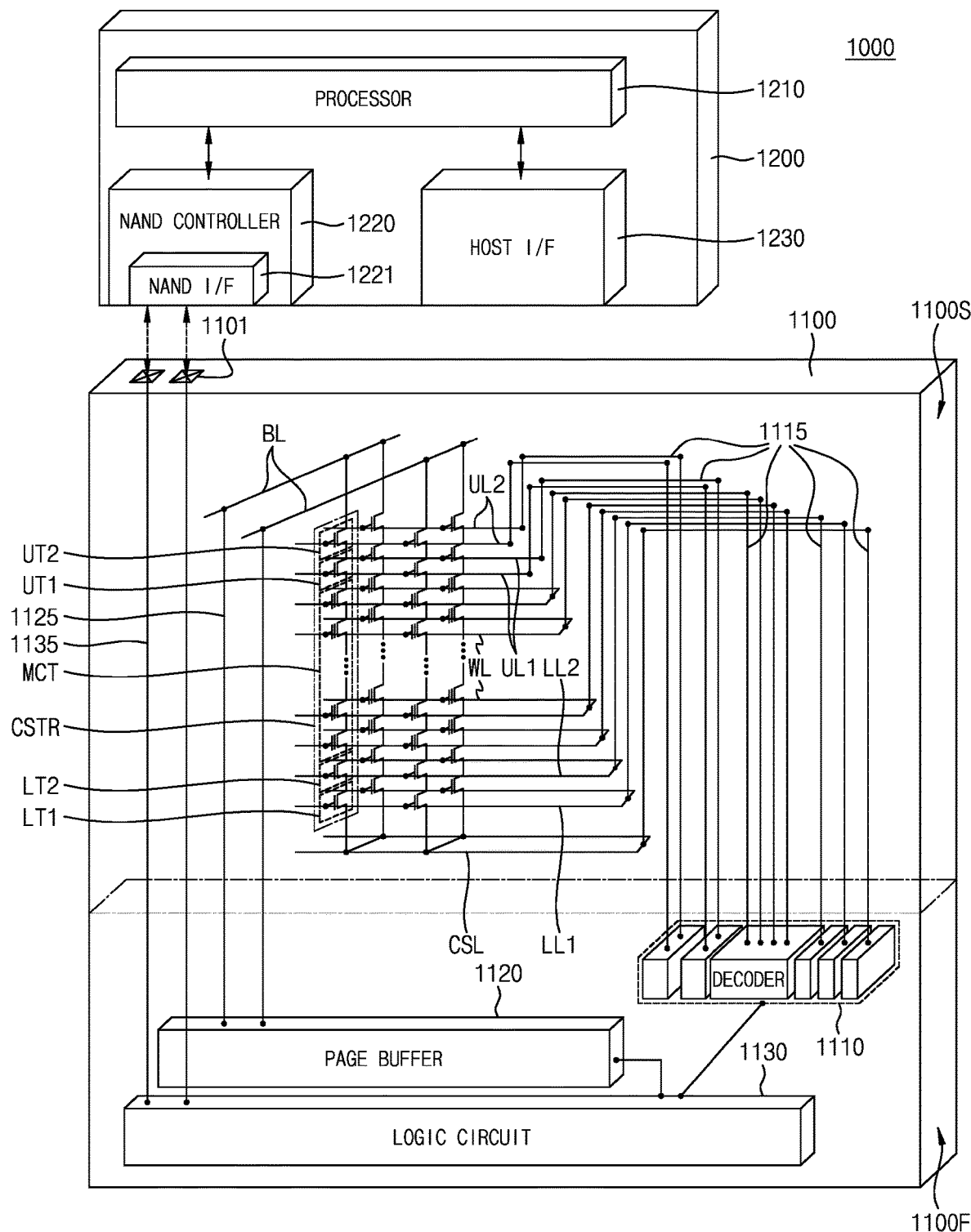
FIG. 45 is a view schematically showing an electronic system including semiconductor devices according to embodiments of the disclosure.

FIG. 45 is a view schematically showing an electronic system including semiconductor devices according to embodiments of the disclosure.

Referring to FIG. 45, an electronic system 1000 may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may include a semiconductor device described with reference to FIGS. 1 to 44. The semiconductor device 1100 may include a first structure 1110F, and a second structure 1100S on the first structure 1110F. In embodiments of the disclosure, the first structure 1110F may be disposed at one side of the second structure 1100S. The first structure 1110F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments of the disclosure.

In embodiments of the disclosure, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

In embodiments of the disclosure, the lower transistors LT1 and LT2 may include a lower erase control transistor LT1 and a ground selection transistor LT2 which are connected in series. The upper transistors UT1 and UT2 may include a string selection transistor UT1 and an upper erase control transistor UT2 which are connected in series. At least one of the lower erase control transistor LT1 and the upper erase control transistor UT1 may be used in an erase operation for deleting data stored in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 via first connecting lines 1115 extending from the first structure 1110F to the second structure 1100S. The bit lines BL may be electrically connected to the page buffer 1120 via second connecting lines 1125 extending from the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 via an input/output connecting line 1135 extending from the first structure 1110F to the second structure 1100S.

The controller 1200 may include a processor 1210, a NAND controller 1220, and a host interface 1230. In accordance with embodiments of the disclosure, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 46:
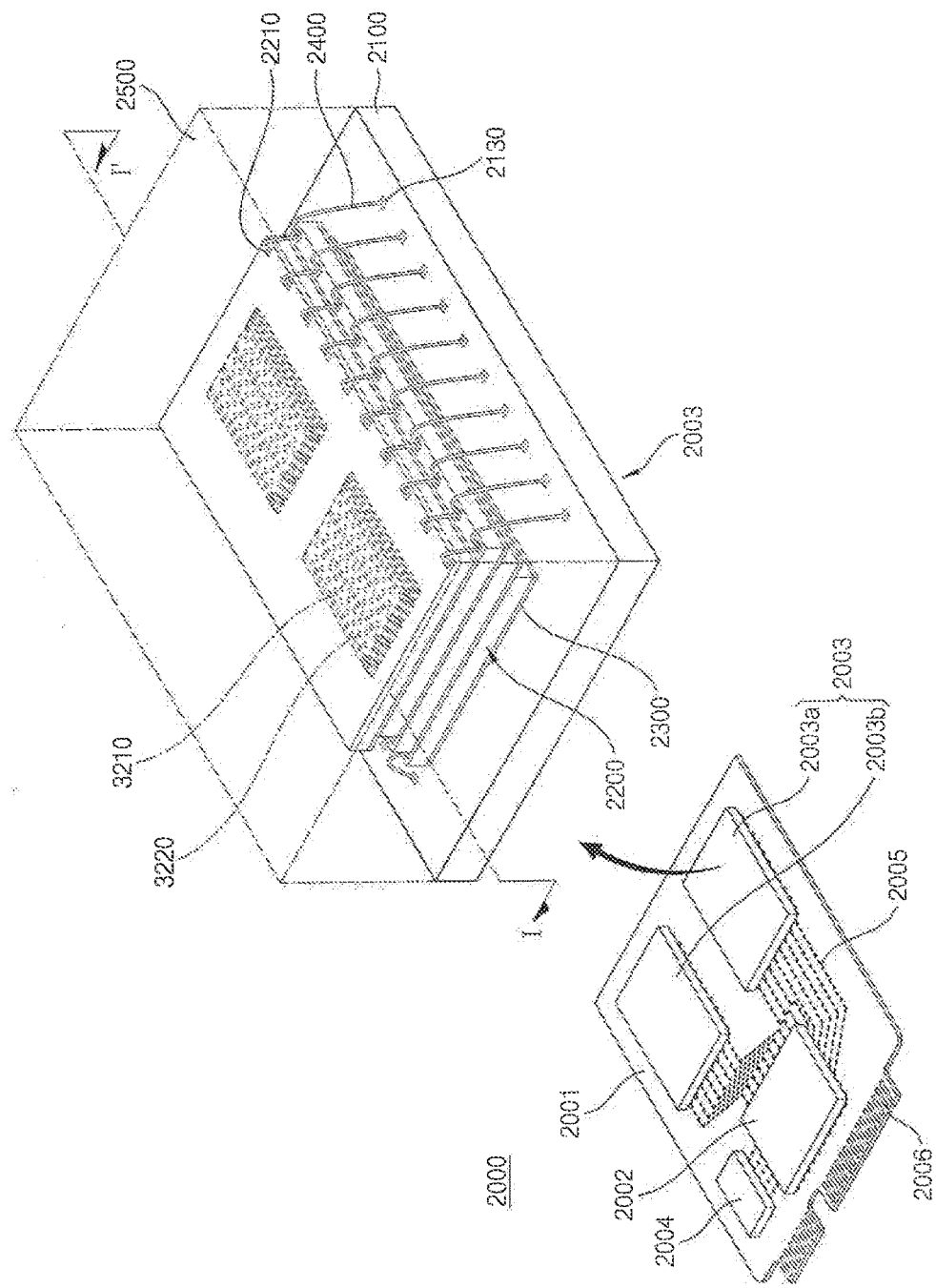
FIG. 46 is a perspective view schematically showing an electronic system including semiconductor devices according to embodiments of the disclosure.

FIG. 46 is a perspective view schematically showing an electronic system including semiconductor devices according to embodiments of the disclosure.

Referring to FIG. 46, an electronic system 2000 according to embodiments of the disclosure may include a main substrate 2001, a controller 2002 mounted on the main substrate 2001, at least one semiconductor package 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins for coupling to an external host. The number and arrangement of the plurality of pins in the connector 2006 may be varied in accordance with a communication interface between the electronic system 2000 and the external host. In embodiments of the disclosure, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In embodiments of the disclosure, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, bonding layers 2300 respectively disposed at lower surfaces of the semiconductor chips 2200, a connecting structure 2400 for electrically connecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 45. Each of the semiconductor chips 2200 may include gate stack structures 3210 and memory channel structures 3220. Each of the semiconductor chips 2200 may include a semiconductor device described with reference to FIGS. 1 to 44. For example, the gate stack structures 3210 may include the first and second stack structures ("51" and "52" in FIG. 1). The memory channel structures 3220 may include the plurality of channel structures ("70" in FIG. 1).

In embodiments of the inventive concept, the connecting structure 2400 may be a bonding wire for electrically connecting the input/output pad 2210 and the package upper pads 2130. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments of the disclosure, in each of the first and second semiconductor packages 2003a and 2003b, the semiconductor chips 2200 may be electrically interconnected by a connecting structure including a through-silicon via (TSV) in place of the bonding wire type connecting structure 2400.

In embodiments of the disclosure, the controller 2002 and the semiconductor chips 2200 may be included in one package. In an embodiment of the disclosure, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 47:
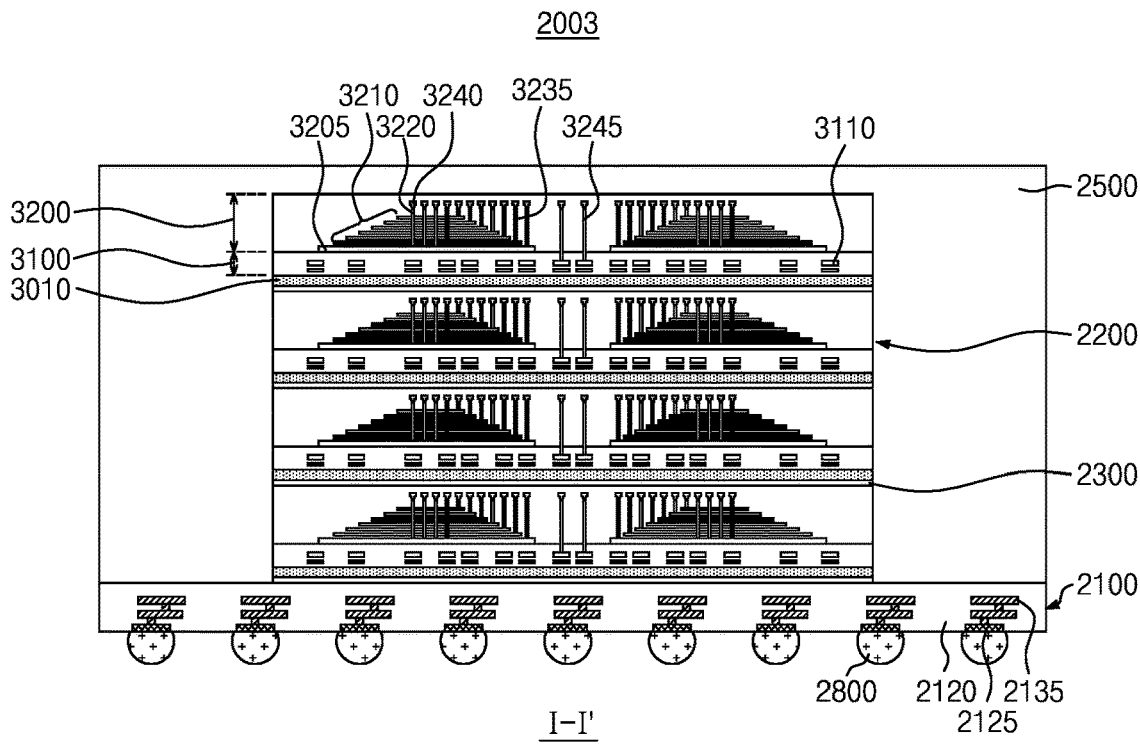
FIGS. 47 and 48 are sectional views schematically showing semiconductor packages according to embodiments of the disclosure.
Figure 48:
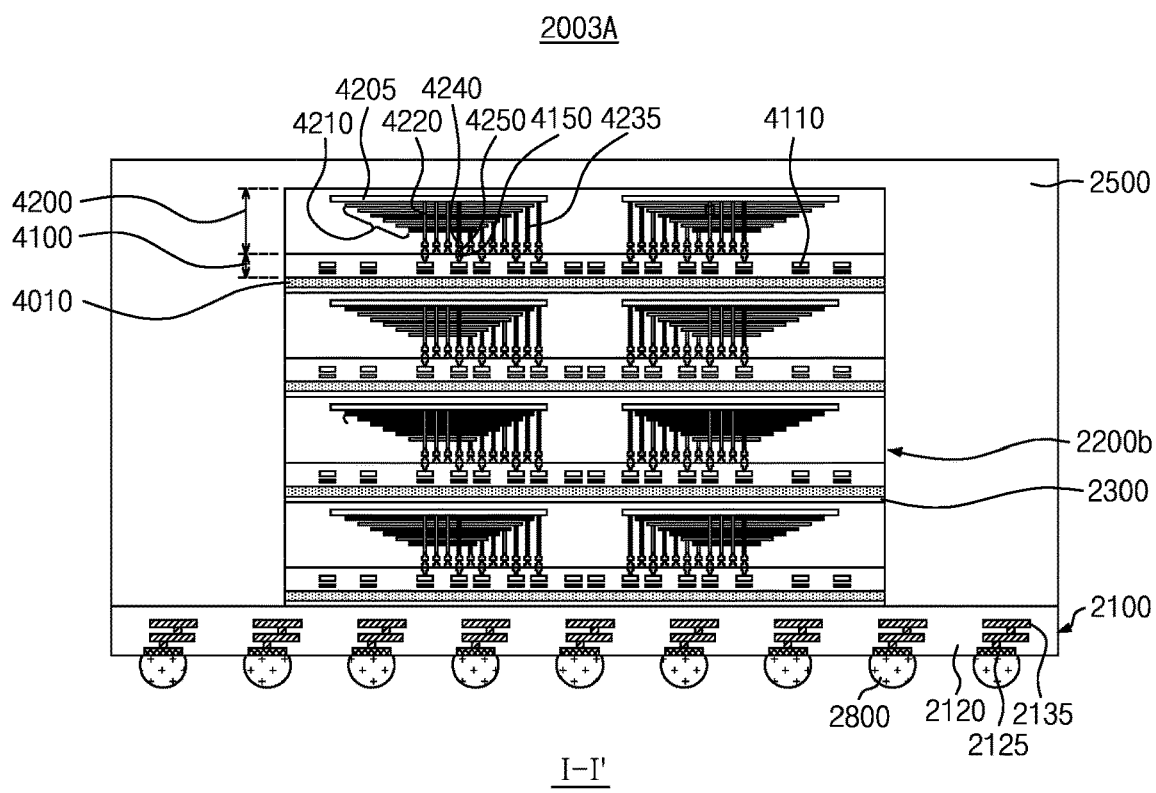

FIGS. 47 and 48 are sectional views schematically showing semiconductor packages according to embodiments of the disclosure. Each of FIGS. 47 and 48 explains an embodiment of the semiconductor package 2003 of FIG. 46, and shows an area of the semiconductor package 2003 taken along line I-I' in FIG. 46.

Referring to FIG. 47, in the semiconductor package 2003 according to the embodiments of the disclosure, the package substrate 2100 thereof may be a printed circuit board. The package substrate 2100 may include a package substrate body 2120, package upper pads ("2130" in FIG. 46) disposed at an upper surface of the package substrate body 2120, lower pads 2125 disposed at a lower surface of the package substrate body 2120 or exposed through the lower surface of the package substrate body 2120, and inner wirings 2135 electrically connecting the package upper pads ("2130" in FIG. 46) and the lower pads 2125 within the package substrate body 2120. The package upper pads ("2130" in FIG. 46) may be electrically connected to connecting structures ("2400" in FIG. 46). The lower pads 2125 may be connected to the wiring patterns 2005 of the main substrate 2001 of the electronic system 2000 through conductive connectors 2800, as shown in FIG. 46.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 extending through the gate stack structure 3210, bit lines 3240 electrically connected to the memory channel structures 3220, and gate connecting wirings 3235 electrically connected to word lines ("WL" in FIG. 45) of the gate stack structure 3210.

In an embodiment of the disclosure, the first structure 3100 may include the plurality of transistors ("27" in FIG. 1) and the plurality of peripheral circuit wiring layers ("31" in FIG. 1). The common source line 3205 may include the horizontal wiring layer ("41" in FIG. 1). The gate stack structure 3210 may include the first and second stack structures ("51" and "52" in FIG. 1). The memory channel structures 3220 may include the plurality of channel structures ("70" in FIG. 1). The bit lines 3240 may include the plurality of bit lines ("93" in FIG. 1).

In an embodiment of the disclosure, each of the semiconductor chips 2200 may further include the plurality of separation patterns 80 described with reference to FIGS. 1 to 44.

Each of the semiconductor chips 2200 may include a through wiring 3245 electrically connected to the peripheral wirings 3110 of the first structure 3100 while extending into the second structure 3200. Each of the semiconductor chips 2200 may be electrically connected to the peripheral wirings 3110 of the first structure 3100. The through wiring 3245 may be disposed outside the gate stack structure 3210, and may be further disposed to extend through the gate stack structure 3210. Each of the semiconductor chips 2200 may further include an input/output pad ("2210" in FIG. 46) electrically connected to the peripheral wirings 3110 of the first structure 3100.

Referring to FIG. 48, in a semiconductor package 2003A according to the embodiments of the disclosure, each of semiconductor chips 2200b thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a common source line 4205, a gate stack structure 4210 between the common source line 4205 and the first structure 4100, memory channel structures 4220 extending through the gate stack structure 4210, and second bonding structures 4250 electrically connected to the memory channel structures 4220 and word lines of the gate stack structure 4210 ("WL" in FIG. 45), respectively. For example, the second bonding structures 4250 may be electrically connected to the memory channel structures 4220 and the word lines ("WL" in FIG. 45) through bit lines 4240 electrically connected to the memory channel structures 4220 and gate connecting wirings 4235 electrically connected to the word lines ("WL" in FIG. 45), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, for example, copper (Cu).

In an embodiment of the disclosure, the first structure 4100 may include the plurality of transistors ("27" in FIG. 8) and the plurality of peripheral circuit wiring layers ("31" in FIG. 8). The common source line 4205 may include the horizontal wiring layer ("41" in FIG. 8). The gate stack structure 4210 may include the first and second stack structures ("51" and "52" in FIG. 8). The memory channel structures 4220 may include the plurality of channel structures ("70" in FIG. 8). The bit lines 4240 may include the plurality of bit lines ("93" in FIG. 8).

In an embodiment of the disclosure, each of the semiconductor chips 2200b may further include the plurality of separation patterns 80 described with reference to FIGS. 1 to 44.

In an embodiment of the disclosure, each of the semiconductor chips 2200b may further include an input/output pad ("2210" in FIG. 46) electrically connected to the peripheral wirings 4110 of the first structure 4100.

The semiconductor chips 2200 of FIG. 47 and the semiconductor chips 2200b of FIG. 48 may be electrically connected by bonding wire type connecting structures ("2400" in FIG. 46). In an embodiment of the disclosure, semiconductor chips in one semiconductor package such as the semiconductor chips 2200 of FIG. 47 and the semiconductor chips 2200b of FIG. 48 may be electrically connected by a connecting structure including a through-silicon via (TSV).

In accordance with the embodiments of the disclosure, a plurality of dummy channel holes formed simultaneously with a plurality of channel holes is enlarged and, as such, a plurality of enlarged dummy channel holes is formed. The plurality of enlarged dummy channel holes may communicate with one another. A plurality of separation patterns is formed in the plurality of enlarged dummy channel holes. Accordingly, devices capable of preventing deformation of a stack structure while simplifying a process, and an electronic system including the semiconductor devices are realized.

While the embodiments of the disclosure have been described with reference to the accompanying drawings, it should be understood by those skilled in the art that various modifications may be made thereto without departing from the scope of the disclosure. Therefore, the above-described embodiments should be considered in a descriptive sense and not for purposes of limitation.

What is claimed is:

1. A semiconductor device, comprising:
a horizontal wiring layer;
a stack structure comprising a plurality of mold layers and a plurality of wiring layers alternately stacked on the horizontal wiring layer;
a plurality of channel structures extending through the stack structure; and
a plurality of separation patterns extending through the stack structure,
wherein each of the plurality of separation patterns comprises a plurality of first areas and a plurality of second areas adjacent to the plurality of first areas, wherein each of the plurality of first areas has a smaller width than each of the plurality of second areas,
wherein:
the plurality of channel structures extends into the horizontal wiring layer;
each of the plurality of separation patterns comprises a plurality of downward protrusions extending into the horizontal wiring layer; and
a distance between a lowermost end of each of the plurality of downward protrusions and a lower surface of the horizontal wiring layer is smaller than a distance between a lowermost end of each of the plurality of channel structures and the lower surface of the horizontal wiring layer.

2. The semiconductor device according to claim 1, wherein:
the plurality of channel structures is arranged in a row direction and a column direction; and
each of the plurality of first areas is aligned with and adjacent to a center of one of the plurality of channel structures arranged in a row nearest to the plurality of separation patterns.

3. The semiconductor device according to claim 1, further comprising:
a lower support between the horizontal wiring layer and the stack structure; and
a sealing conductive layer between the horizontal wiring layer and the lower support,
wherein the plurality of channel structures and the plurality of separation patterns extend through the lower support and the sealing conductive layer,
wherein a side surface of the lower support is misaligned with a side surface of the stack structure.

4. The semiconductor device according to claim 3, wherein a thickness of the sealing conductive layer is 1.2 to 5 times a thickness of each of the plurality of wiring layers.

5. The semiconductor device according to claim 3, wherein:
the stack structure comprises a first section disposed between a pair of the plurality of separation patterns;
the lower support comprises a second section disposed between the pair of the plurality of separation patterns; and
a maximum horizontal width of the first section is smaller than a maximum horizontal width of the second section.

6. The semiconductor device according to claim 3, wherein the plurality of separation patterns contacts a side surface and an upper surface of the lower support.

7. The semiconductor device according to claim 3, wherein the plurality of downward protrusions extend through the lower support and the sealing conductive layer and into the horizontal wiring layer.

8. The semiconductor device according to claim 7, wherein a width of the plurality of downward protrusions between the lower support is less than a width of the plurality of separation patterns between the stack structure.

9. The semiconductor device according to claim 7, wherein a width of the plurality of downward protrusions between the sealing conductive layer is less than a width of the plurality of separation patterns between the stack structure.

10. The semiconductor device according to claim 1, further comprising:
an upper support on the stack structure and the plurality of channel structures,
wherein each of the plurality of separation patterns comprises a plurality of upward protrusions extending through the upper support.

11. The semiconductor device according to claim 10, wherein:
the plurality of upward protrusions contact an upper insulating layer.

12. A semiconductor device, comprising:
a horizontal wiring layer;
a stack structure comprising a plurality of mold layers and a plurality of wiring layers alternately stacked on the horizontal wiring layer;
a lower support between the horizontal wiring layer and the stack structure;
a sealing conductive layer between the horizontal wiring layer and the lower support;
a plurality of channel structures extending into the horizontal wiring layer via the stack structure, the lower support and the sealing conductive layer; and
a plurality of separation patterns intersecting the stack structure and extending into the horizontal wiring layer via the lower support and the sealing conductive layer,
wherein a side surface of the lower support is misaligned with a side surface of the stack structure,
wherein at least one of the plurality of separation patterns comprises a downward protrusion extending into the horizontal wiring layer via the lower support and the sealing conductive layer, and
wherein the downward protrusion terminates at a lower elevation in the horizontal wiring layer compared to termination points of the channel structures in the horizontal wiring layer.

13. The semiconductor device according to claim 12, wherein:
the stack structure comprises a first section disposed between a pair of the plurality of separation patterns;
the lower support comprises a second section disposed between the pair of the plurality of separation patterns; and
a maximum horizontal width of the first section is smaller than a maximum horizontal width of the second section.

14. The semiconductor device according to claim 12, wherein the plurality of separation patterns contacts a side surface and an upper surface of the lower support.

15. The semiconductor device according to claim 12, wherein:
the plurality of channel structures is arranged in a row direction and a column direction:
each of the plurality of separation patterns comprises a plurality of first portions having a smaller width than second portions of the separation pattern; and
each of the first portions is aligned with and adjacent to a center of one of the plurality of channel structures arranged in a row nearest to the plurality of separation patterns.

16. The semiconductor device according to claim 12, further comprising:
an upper support on the stack structure,
wherein each of the plurality of separation patterns comprises a plurality of upward protrusions extending through the upper support.

17. An electronic system, comprising:
a semiconductor device; and
a controller to control the semiconductor device,
wherein the semiconductor device comprises
a horizontal wiring layer,
a stack structure comprising a plurality of mold layers and a plurality of wiring layers alternately stacked on the horizontal wiring layer,
a plurality of channel structures extending through the stack structure, and
a plurality of separation patterns extending through the stack structure,
wherein each of the plurality of separation patterns comprises a plurality of first portions having a smaller width than a plurality of second portions of the plurality of separation patterns,
wherein the controller is electrically connected to the semiconductor device, and wherein a penetration depth of a downward protrusion of the separation patterns in the horizontal wiring layer is greater than a penetration depth of the channel structures in the horizontal wiring layer.

* * * * *